(12) United States Patent
Lee et al.

(10) Patent No.: US 10,746,995 B2
(45) Date of Patent: Aug. 18, 2020

(54) DISPLAY MODULE AND HEAD MOUNTED DISPLAY DEVICE

(71) Applicant: SAMSUNG DISPLAY CO., LTD., Yongin-si, Gyeonggi-do (KR)

(72) Inventors: Soyoung Lee, Yongin-si (KR); Sunyoung Jung, Yongin-si (KR); Hyunho Kim, Yongin-si (KR); Chungsock Choi, Yongin-si (KR); Sang-hwan Cho, Yongin-si (KR); Cheol Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 347 days.

(21) Appl. No.: 15/627,492

(22) Filed: Jun. 20, 2017

(65) Prior Publication Data

US 2018/0074326 A1 Mar. 15, 2018

(30) Foreign Application Priority Data

Sep. 9, 2016 (KR) .......................... 10-2016-0116780

(51) Int. Cl.
*G02B 27/01* (2006.01)
*G02B 1/116* (2015.01)
(Continued)

(52) U.S. Cl.
CPC .......... *G02B 27/0172* (2013.01); *G02B 1/116* (2013.01); *G02B 7/002* (2013.01); *G02B 26/001* (2013.01); *G02B 26/02* (2013.01); *G02B 26/06* (2013.01); *G02B 27/0176* (2013.01); *H01L 51/5012* (2013.01); *H01L 51/5203* (2013.01); *H01L 51/5262* (2013.01); *G02B 1/00* (2013.01); *G02B 2027/012* (2013.01); *G02B 2027/014* (2013.01); *G02B 2027/0112* (2013.01);
(Continued)

(58) Field of Classification Search
CPC ... G02B 1/00; G02B 1/111; G02B 2027/0112; G02B 2027/012; G02B 26/001; G02B 26/02; G02B 26/06; G02B 27/0172; G02B 27/0176; G02B 7/002; H01L 51/5012; H01L 51/5203; H01L 51/5262
See application file for complete search history.

(56) References Cited

U.S. PATENT DOCUMENTS

2004/0044127 A1 3/2004 Okubo et al.
2015/0187857 A1* 7/2015 Negishi ............... H01L 27/3272
257/40
(Continued)

FOREIGN PATENT DOCUMENTS

KR 10-2004-0085975 A 10/2004
KR 10-2006-0135795 A 12/2006
(Continued)

*Primary Examiner* — Joseph P Martinez
*Assistant Examiner* — Vipin Patel
(74) *Attorney, Agent, or Firm* — Lewis Roca Rothgerber Christie LLP

(57) ABSTRACT

Provided is a head mounted display device including a housing for providing a darkroom space, a display module in the housing and to display an image, and an optical lens for expanding the image to provide the image to a user. The display module includes a destructive interference structure which removes the image reflected from the optical lens without reflecting the image again.

31 Claims, 24 Drawing Sheets

(51) Int. Cl.
  *G02B 7/00*     (2006.01)
  *G02B 26/00*    (2006.01)
  *G02B 26/02*    (2006.01)
  *G02B 26/06*    (2006.01)
  *H01L 51/50*    (2006.01)
  *H01L 51/52*    (2006.01)
  *G02B 1/00*     (2006.01)

(52) U.S. Cl.
  CPC ........... *G02B 2027/0132* (2013.01); *G02B 2027/0138* (2013.01)

(56) References Cited

U.S. PATENT DOCUMENTS

2016/0079567 A1    3/2016    Cho et al.
2016/0156900 A1*   6/2016    Aruga ............... G02B 27/0172
                                                         345/419

FOREIGN PATENT DOCUMENTS

| KR | 10-2009-0128237 | A | 12/2009 |
| KR | 10-2012-0092907 | A | 8/2012  |
| KR | 10-2016-0031108 | A | 3/2016  |
| KR | 10-2016-0043227 | A | 4/2016  |
| KR | 10-2016-0082864 | A | 7/2016  |
| WO | WO 2016/081697  | A1 | 5/2016 |

* cited by examiner

FIG. 5C

| Light Efficiency (%) AgMg Thickness (Å) | Mn Thickness (Å) | | | | | | | | | | | | | | |
|---|---|---|---|---|---|---|---|---|---|---|---|---|---|---|---|
| | 20 | 22 | 24 | 26 | 28 | 30 | 48 | 65 | 83 | 100 | 118 | 135 | 153 | 170 | 188 | 205 | 223 | 240 | 258 |
| 70 | 155% | 148% | 142% | 137% | 131% | 126% | 122% | 117% | 113% | 109% | 105% | 101% | 98% | 94% | 91% | 88% | 85% | 82% | 80% |
| 95 | 161% | 154% | 148% | 142% | 136% | 131% | 126% | 122% | 117% | 113% | 109% | 105% | 101% | 98% | 94% | 91% | 88% | 85% | 82% |
| 120 | 166% | 159% | 152% | 146% | 140% | 135% | 130% | 125% | 120% | 116% | 111% | 107% | 104% | 100% | 97% | 93% | 90% | 87% | 84% |
| 145 | 169% | 162% | 155% | 149% | 143% | 137% | 132% | 126% | 122% | 117% | 113% | 109% | 105% | 101% | 98% | 94% | 91% | 88% | 85% |
| 170 | 171% | 164% | 156% | 150% | 144% | 138% | 132% | 127% | 122% | 117% | 113% | 109% | 105% | 101% | 98% | 94% | 91% | 88% | 85% |
| 195 | 171% | 164% | 156% | 149% | 143% | 137% | 132% | 126% | 121% | 117% | 112% | 108% | 104% | 100% | 96% | 93% | 90% | 86% | 83% |
| 220 | 170% | 162% | 155% | 148% | 141% | 135% | 130% | 124% | 119% | 115% | 110% | 106% | 102% | 98% | 94% | 91% | 88% | 84% | 81% |
| 245 | 168% | 159% | 152% | 145% | 139% | 132% | 127% | 121% | 116% | 112% | 107% | 103% | 99% | 95% | 92% | 88% | 85% | 82% | 79% |

FIG. 5D

| Reflectance (%) AgMg Thickness (Å) | \\ Mn Thickness (Å) 20 | 22 | 24 | 26 | 28 | 30 | 48 | 65 | 83 | 100 | 118 | 135 | 153 | 170 | 188 | 205 | 223 | 240 | 258 |
|---|---|---|---|---|---|---|---|---|---|---|---|---|---|---|---|---|---|---|---|
| 70 | 41.3% | 35.9% | 31.4% | 27.6% | 24.5% | 21.9% | 19.8% | 18.2% | 16.8% | 15.8% | 15.0% | 14.5% | 14.1% | 13.9% | 13.9% | 14.0% | 14.1% | 14.4% | 14.7% |
| 95 | 41.7% | 35.9% | 31.1% | 27.1% | 23.7% | 21.0% | 18.8% | 17.0% | 15.6% | 14.5% | 13.7% | 13.2% | 12.8% | 12.6% | 12.5% | 12.6% | 12.8% | 13.0% | 13.4% |
| 120 | 42.5% | 36.3% | 31.2% | 26.9% | 23.4% | 20.5% | 18.2% | 16.3% | 14.8% | 13.6% | 12.8% | 12.2% | 11.8% | 11.5% | 11.5% | 11.5% | 11.7% | 12.0% | 12.3% |
| 145 | 43.6% | 37.0% | 31.6% | 27.0% | 23.3% | 20.3% | 17.8% | 15.8% | 14.2% | 13.0% | 12.1% | 11.4% | 11.0% | 10.7% | 10.7% | 10.7% | 10.9% | 11.1% | 11.5% |
| 170 | 44.9% | 37.9% | 32.2% | 27.4% | 23.5% | 20.3% | 17.7% | 15.6% | 13.9% | 12.6% | 11.6% | 10.9% | 10.4% | 10.2% | 10.0% | 10.1% | 10.2% | 10.5% | 10.8% |
| 195 | 46.3% | 39.0% | 32.9% | 27.9% | 23.8% | 20.4% | 17.7% | 15.5% | 13.7% | 12.4% | 11.3% | 10.6% | 10.0% | 9.7% | 9.6% | 9.6% | 9.7% | 10.0% | 10.3% |
| 220 | 47.8% | 40.1% | 33.8% | 28.5% | 24.2% | 20.7% | 17.8% | 15.5% | 13.7% | 12.2% | 11.1% | 10.3% | 9.8% | 9.4% | 9.3% | 9.3% | 9.4% | 9.6% | 9.9% |
| 245 | 49.2% | 41.2% | 34.6% | 29.2% | 24.7% | 21.0% | 18.0% | 15.6% | 13.7% | 12.2% | 11.0% | 10.2% | 9.6% | 9.2% | 9.0% | 9.0% | 9.1% | 9.3% | 9.6% |

FIG. 7B

| | Reduce Reflection by 3.37% | Reduce Reflection by 3.45% | Reduce Reflection by 2.93% |
|---|---|---|---|
| | Glass | Glass | Glass |
| SL1 | SiNx(200Å) | SiNx(200Å) | SiNx(200Å) |
| SL2 | SiOx(200Å) | SiOx(200Å) | SiOx(200Å) |
| SL3 | SiNx(900Å) | SiNx(900Å) | SiNx(900Å) |
| SL4 | SiOx(800Å) | SiOx(900Å) | SiOx(1,000Å) |

DISPLAY MODULE AND HEAD MOUNTED DISPLAY DEVICE

CROSS-REFERENCE TO RELATED APPLICATION

Korean Patent Application No. 10-2016-0116780, filed on Sep. 9, 2016, and entitled: "Display Module And Head Mounted Display Device," is incorporated by reference herein in its entirety.

BACKGROUND

1. Field

The present disclosure herein relates to a display module and a head mounted display device, and more particularly, to a display module with reduced reflectance and a head mounted display device with improved display quality.

2. Description of the Related Art

There have been developed various display devices used for multimedia apparatus, such as televisions, cellular phones, tablet computers, navigation units, and game machines. Head mounted display devices are electronic devices which are mounted on the heads of users for providing images to the users, and have been highlighted as media devices for providing virtual reality and augmented reality.

SUMMARY

An embodiment provides a head mounted display device including a housing for providing a darkroom space, a display module disposed in the housing and displaying an image, and an optical lens for expanding the image to provide the image to eyeballs of a user.

The display module includes: a first electrode on a base layer; a second electrode closer to the optical lens than the first electrode; a light-emitting element layer including a light-emitting layer between the first and second electrodes; a reflection preventing layer on the second electrode; and a phase control layer between the second electrode and the reflection preventing layer. The phase control layer may destructively interfere a first light beam reflected from the optical lens and then from the second electrode, and a second light beam reflected image from the optical lens and then from the reflection preventing layer.

In an embodiment, the reflection preventing layer may include at least one selected from chromium (Cr), molybdenum ((Mo)), titanium (Ti), cobalt (Co), nickel (Ni), aluminum (Al), tungsten (W), manganese (Mn), tellurium (Te), $Ni_xP$, $CrN_x$, $TiN_x$, $TiAlN_x$, $MoO_x$ and $CuO_x$.

In an embodiment, the reflection preventing layer may include a material having a refractive index and an extinction ratio such that the product of the refractive index and the extinction ratio is greater than about 1 and less than about 6.

In an embodiment, the second electrode may include one or more materials of silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg and CaAg.

In an embodiment, an encapsulating substrate spaced apart from the reflection preventing layer to encapsulate the light-emitting element layer may be further included.

The head mounted display device according to an embodiment may further include a phase compensating layer on the phase control layer, wherein a refractive index of the phase compensating layer is smaller than that of the reflection preventing layer and is greater than that of a medium between the phase compensating layer and the encapsulating substrate. In an embodiment the medium may be air or a sealing material. In an embodiment, the refractive index of the phase compensating layer may be greater than about 1.0 and smaller than about 2.0.

In an embodiment, a hybrid layer including first refractive index layers and second refractive index layers having different refractive indexes and alternately disposed with the first refractive index layers may be further included. The encapsulating substrate may include a lower surface and an upper surface closer to the optical lens than the lower surface, and the hybrid layer may be on the lower surface.

In an embodiment, each of the first refractive index layers may include one of a silicon oxide layer, a silicon oxynitride layer and a silicon nitride layer, and each of the second refractive index layers may include one different from the one of a silicon oxide layer, a silicon oxynitride layer and a silicon nitride layer.

In an embodiment, a thin film encapsulating layer disposed on the reflection preventing layer to encapsulate the light-emitting element layer may be further included.

The thin film encapsulating layer may include: an organic layer; at least one lower inorganic layer between the reflection preventing layer and the organic layer and having a refractive index greater than the organic layer; and at least one upper inorganic layer on the organic layer and having a refractive index greater than the organic layer.

In an embodiment, the lower inorganic layer may include: a first lower inorganic layer between the reflection preventing layer and the organic layer and having a first refractive index; and a second lower inorganic layer between the first lower inorganic layer and the organic layer and having a second refractive index less than the first refractive index.

In an embodiment, the upper inorganic layer may include: a first upper inorganic layer on the organic layer and having the first refractive index; and a second upper inorganic layer between the first upper inorganic layer and the organic layer and having the second refractive index less than the first refractive index.

In an embodiment, the upper inorganic layer may further include a third upper inorganic layer on the first upper inorganic layer and including the same material as the second upper inorganic layer.

In an embodiment, the second lower inorganic layer may include more oxygen atoms in the same volume than the first lower inorganic layer.

In an embodiment, the second upper inorganic layer may include more oxygen atoms in the same volume than the first upper inorganic layer.

In an embodiment, the second lower inorganic layer may have be thinner than the first lower inorganic layer, and the second upper inorganic layer may be thinner than the first upper inorganic layer.

In an embodiment, a color compensating layer directly disposed on the reflection preventing layer may be further included, wherein the color compensating layer may include silicon nitride.

In an embodiment, a thickness of the color compensating layer may be about 400 angstrom to about 800 angstrom.

In an embodiment, the housing may include: a body part; a partitioning wall coupled to the body part and configured to partition the darkroom space into a first darkroom space and a second darkroom space; and a first sight window and the second sight window which are coupled to the body part and provides the image to the user.

The display module may include: a first display module disposed in the first darkroom space and configured to provide a first image to a first eyeball of the user; and a second display module disposed in the second darkroom space and configured to provide a second image to a second eyeball of the user.

In an embodiment, a display module may include a light-emitting element layer including a first electrode disposed on a base layer, a second electrode disposed on the first electrode and to receive external light before the first electrode, and a light-emitting layer between the first electrode and the second electrode, a reflection preventing layer on the second electrode, a phase control layer between the second electrode and the reflection preventing layer and to subject, to destructive interference, first reflected light reflected from the second electrode and second reflected light reflected from the reflection preventing layer among the external light; and a thin film encapsulating layer on the reflection preventing layer and to encapsulate the light-emitting element layer. In an embodiment, the thin film encapsulating layer may include: an organic layer; at least one lower inorganic layer between the reflection preventing layer and the organic layer and having a refractive index greater than the organic layer; and at least one upper inorganic layer disposed on the organic layer and having a refractive index greater than the organic layer.

In an embodiment, the lower inorganic layer may include: a first lower inorganic layer disposed between the reflection preventing layer and the organic layer and having a first refractive index; and a second lower inorganic layer disposed between the first lower inorganic layer and the organic layer and having a second refractive index smaller than the first refractive index.

In an embodiment, the upper inorganic layer may include: a first upper inorganic layer disposed on the organic layer and having the first refractive index; and a second upper inorganic layer between the first upper inorganic layer and the organic layer and having the second refractive index smaller than the first refractive index.

In an embodiment, the upper inorganic layer may further include a third upper inorganic layer disposed on the first upper inorganic layer and including the same material as the second upper inorganic layer.

In an embodiment, the second lower inorganic layer may include more oxygen atoms in the same volume than the first lower inorganic layer, and the second upper inorganic layer may include more oxygen atoms in the same volume than the first upper inorganic layer In an embodiment, the second lower inorganic layer may have a thickness smaller than the first lower inorganic layer, and the second upper inorganic layer may have a thickness smaller than the first upper inorganic layer.

In an embodiment, a color compensating layer directly disposed on the reflection preventing layer may be further included, wherein the color compensating layer may include silicon nitride. In an embodiment, a thickness of the color compensating layer may be about 400 angstrom to about 800 angstrom.

BRIEF DESCRIPTION OF THE DRAWINGS

Features will become apparent to those of skill in the art by describing in detail exemplary embodiments with reference to the attached drawings in which:

FIG. 5C illustrates a comparison table illustrating light efficiency of a destructive interference structure according to an embodiment;

FIG. 5D illustrates a comparison table illustrating reflectance of the destructive interference structure according to an embodiment;

FIG. 7B illustrates an enlarged cross-sectional view of the hybrid layer illustrated in FIG. 7A;

DETAILED DESCRIPTION

Figure 1A:
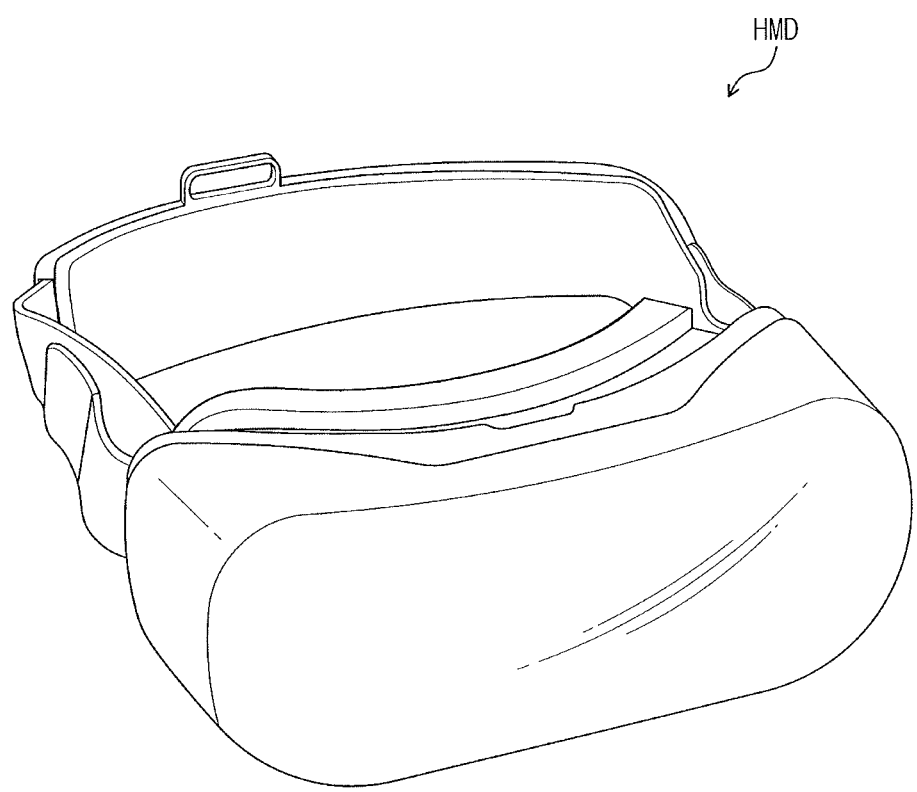
FIG. 1A illustrates a perspective view of a head mounted display device according to an embodiment.
Figure 1A:
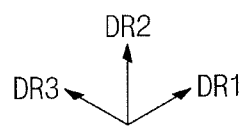

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms of first and second are used herein to describe various elements, these elements should not be limited by these terms. Terms are only used to distinguish one component from other components. For example, an element referred to as a first element in one embodiment can be referred to as a second element in another embodiment. The terms of a singular form may include plural forms unless referred to the contrary.

Furthermore, terms such as "under", "below", "over", "above" are used to describe relationships between configurations illustrated in the drawings. The above-mentioned terms have a relative concept, and are described with respect to the direction shown in the drawings.

In the specification, it should be understood that the meaning of "include" or "have" specifies the existence of a property, a numeral, a step, an operation, an element, a part or a combination thereof, but does not exclude, in advance, the possibility of existence or addition of other properties, numerals, steps, operations, elements, parts or combinations thereof.

Figure 1B:
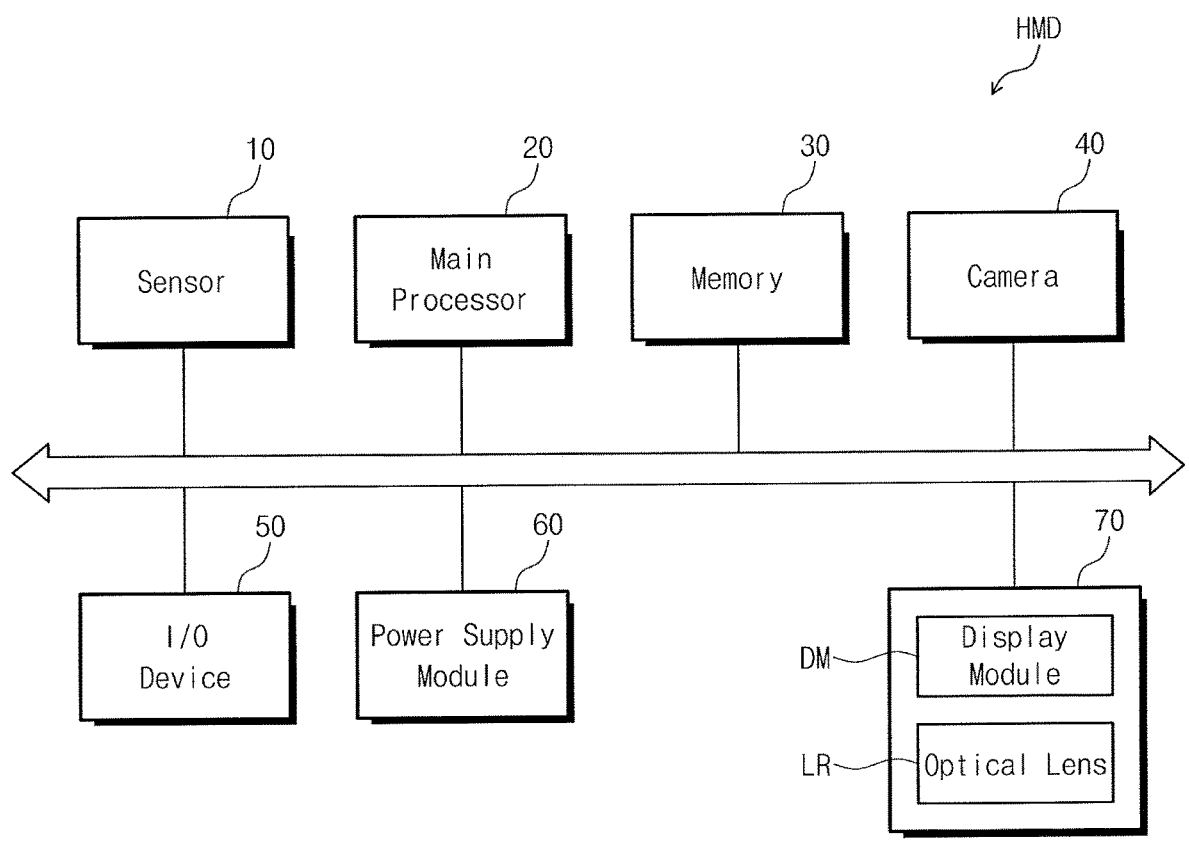
FIG. 1B illustrates a block diagram of a head mounted display device according to an embodiment.
Figure 1C:
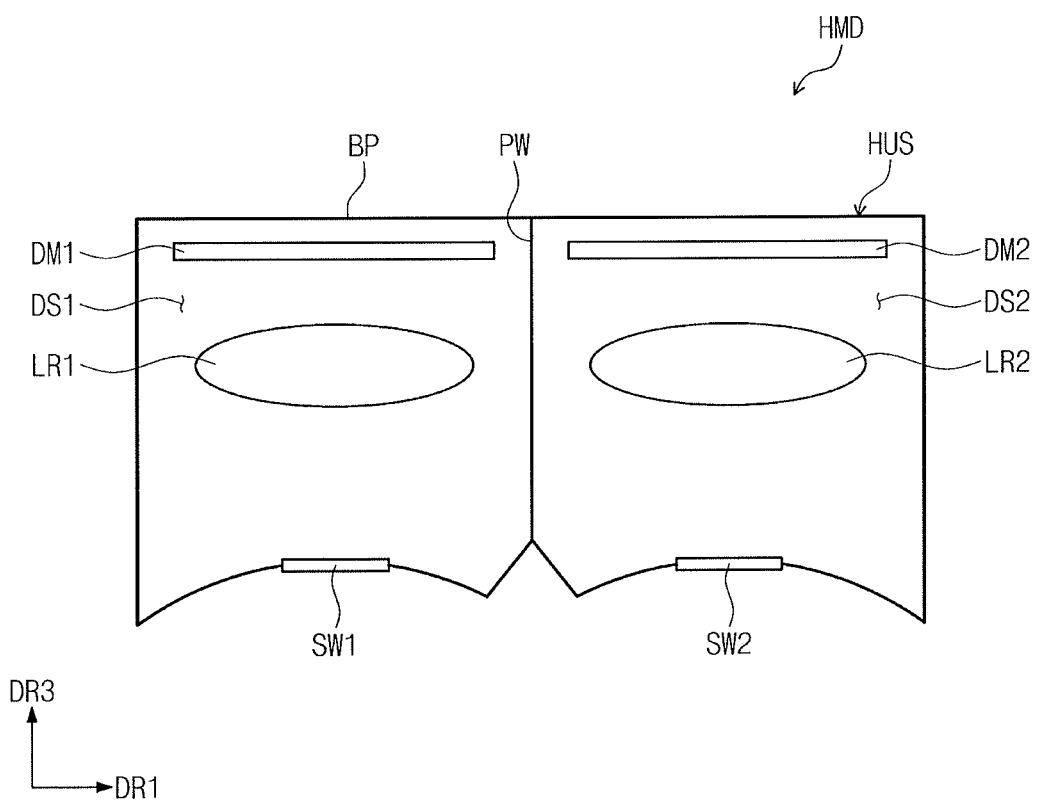
FIG. 1C illustrates a cross-sectional view of a head mounted display device according to an embodiment.

FIG. 1A is a perspective view of a head mounted display device HMD according to an embodiment. FIG. 1B is a block diagram of a head mounted display device HMD according to an embodiment. FIG. 1C is a cross-sectional view of a head mounted display device HMD according to an embodiment.

The head mounted display device HMD illustrated in FIG. 1A may be operated by being mounted on the head of a user. The head mounted display device HMD may provide a user with virtual reality or augmented reality.

The head mounted display device HMD may provide the user with a three-dimensional image through a display device. In an embodiment, the head mounted display device HMD may provide the user with images of external environment/external objects captured by a camera.

As illustrated in FIG. 1B, the head mounted display device HMD includes a sensor 10, a main processor 20, a memory 30, a camera 40, an input/output device 50, a power supply module 60 and a display device 70. At least some of the electronic modules may be mounted on a circuit board, and other electronic modules not mounted on the circuit board may be electrically connected through the circuit board and a flexible circuit board.

The sensor 10 may to detect and trace the motions of user's head, e.g., may include at least one of a gyroscope, an accelerometer, a magnetometer, and so forth. The main processor 20 may perform various computing functions. The main processor 20 may be a microprocessor and control the entire operation of the head mounted display device HMD.

The memory 30 may store data for operations of the head mounted display device HMD. The camera 40 may capture images of external environment/external objects. The input/output device 50 functions as an interface connected to an external charger, a wired/wireless data port, a card socket (for example, a memory card, subscriber identification module (SIM) card, user identification module (UIM) card, and so forth), or the like. The power supply module 60 supplies power required for overall operations of the head mounted display device HMD. The power supply module 60 may include a common battery.

The display device 70 may include a display module DM and an optical lens LR. The display module DM according to an embodiment has a higher resolution than that of a general mobile device. The display module DM according to an embodiment may have, for example, a resolution of about 400 pixels per inch (PPi). The optical lens LR expands the image formed in the display module DM and provides the expanded image to an eyeball of a user. For example, the optical lens LR may include a convex lens. Although not separately shown, the display device 70 may further include a lens for controlling the foci of images.

As illustrated in FIG. 1C, the head mounted display device HMD includes a housing HUS which provides a darkroom space. The above-mentioned electronic modules are outside the housing HUS. The display device 70 is in the darkroom space. Although not shown, the head mounted display device HMD may further include an exterior member which covers a bracket for mounting the above-mentioned electronic modules and the electronic modules.

The housing HUS includes a body part BP, a partition wall PW which is coupled to the body part BP to divide the darkroom space into a first darkroom space DS1 and a second darkroom space DS2, and first and second sight windows SW1 and SW2 which provide images to the user. The display device 70 may be disposed in each of the first and second darkroom spaces DS1 and DS2. A first display module DM1 and a first optical lens LR1 may be disposed in the first darkroom space DS1, and a second display module DM2 and a second optical lens LR2 may be disposed in the second darkroom space DS2.

The first display module DM1 and the first optical lens LR1 may provide a first image to a first eyeball of the user. The second display module DM2 and a second optical lens LR2 may provide a second image to a second eyeball of the user.

Figure 2:
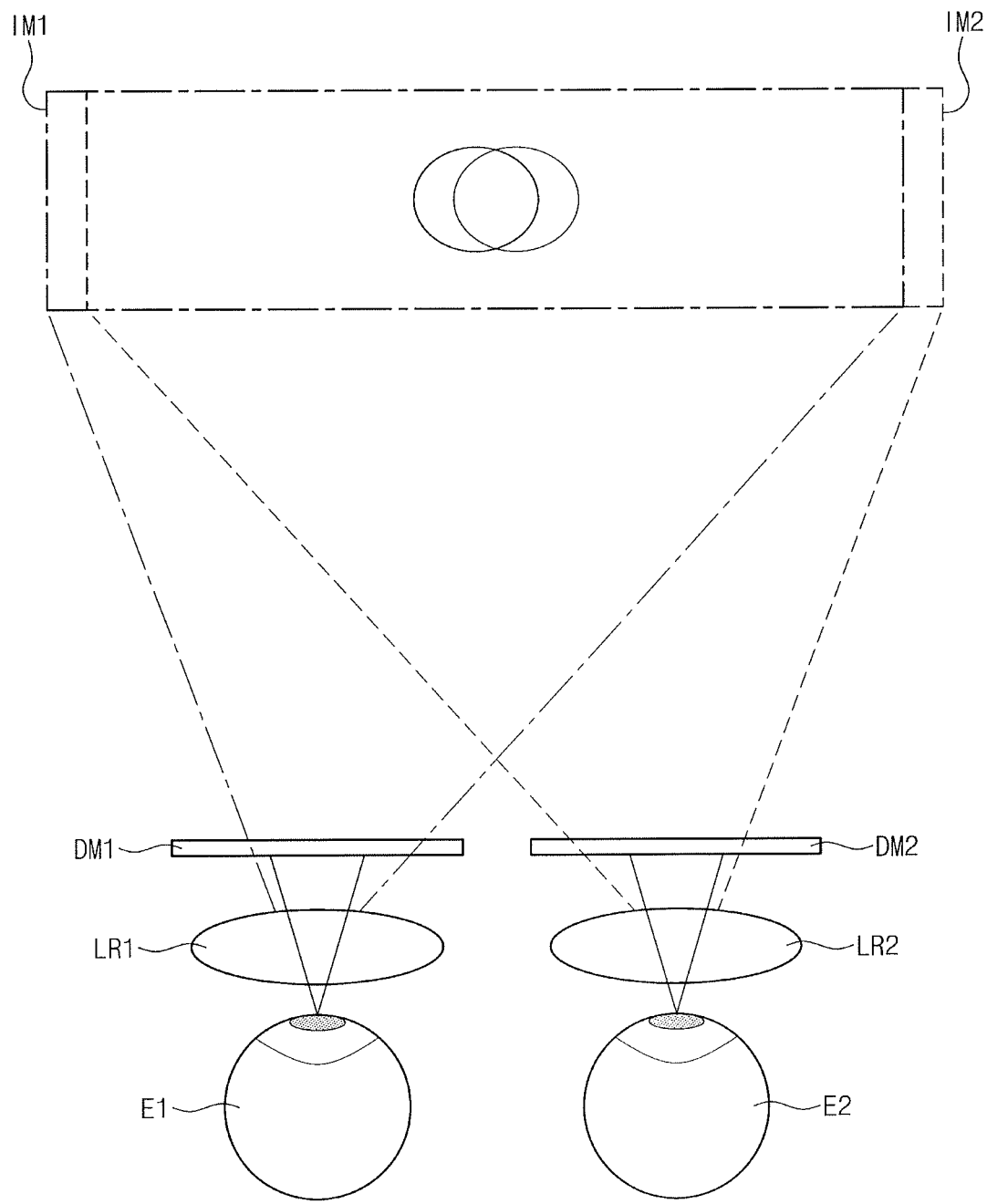
FIG. 2 illustrates a three-dimensional image provided by a head mounted display device according to an embodiment.

FIG. 2 illustrates a three-dimensional image provided by a head mounted display device HMD according to an embodiment. The first eyeball E1 of the user recognizes the first image displayed on the first display module DM1. The user recognizes an imaginary image IM1 of the first image expanded through the first optical lens LR1. The second eyeball E2 of the user recognizes the second image displayed on the second display module DM2. The user recognizes an imaginary image IM2 of the second image expanded through the second optical lens LR2. The first imaginary image IM1 and the second imaginary image IM2 provide a disparity. Accordingly, the user may recognize a three-dimensional image.

Figure 3A:
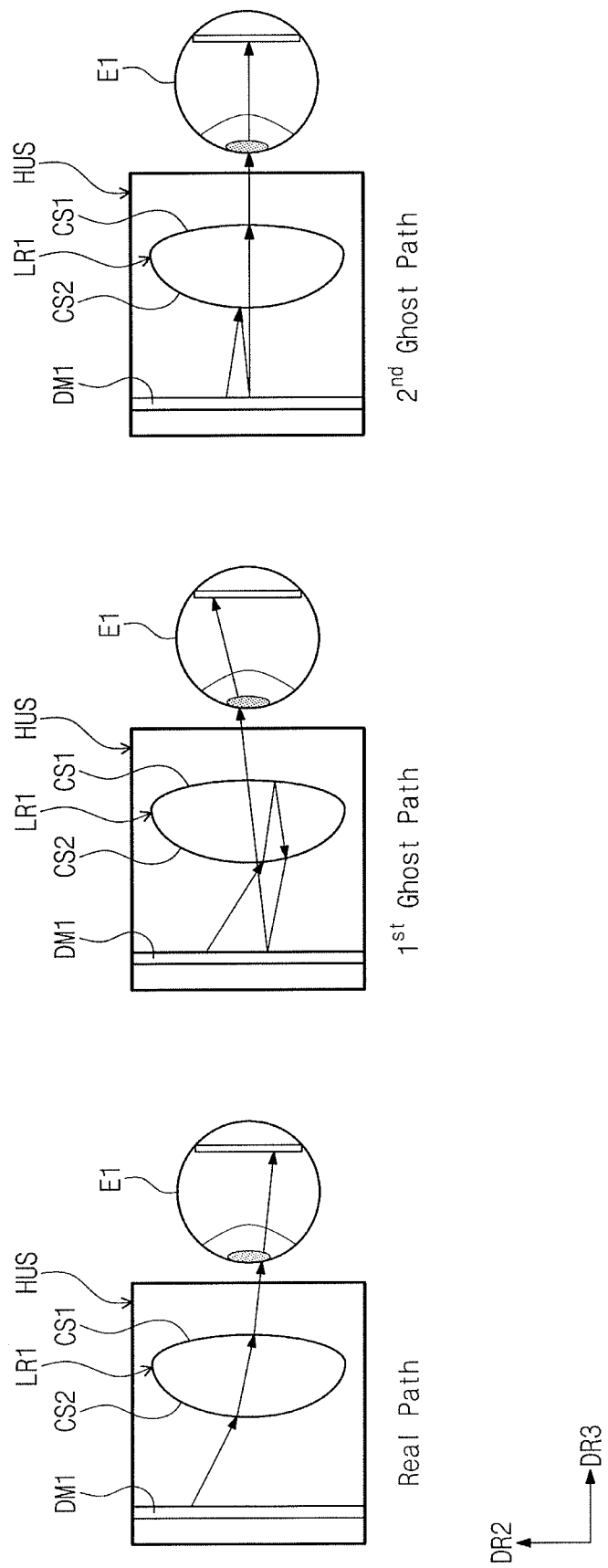
FIG. 3A illustrates paths through which an image formed in a display module is provided to a user.
Figure 3B:
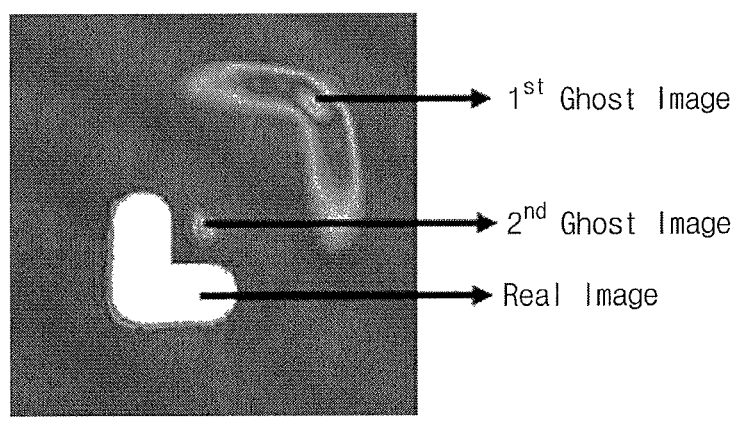
FIG. 3B illustrates an image provided to the user.

FIG. 3A illustrates paths through which images formed in the display module DM are provided to the eyeball E1 of the user. FIG. 3B illustrates an image provided to the eyeball E1 of the user.

A left schematic of FIG. 3A illustrates a normal image provided through a real or normal path, e.g., from the first display module DM1 through the lens LR1 to the eyeball E1. Ghost images may be provided to the user through ghost paths through which a normal image is reflected again from the first optical lens LR1 and the first display module DM1.

In particular, a middle schematic of FIG. 3A illustrates a first ghost path in which the normal image reflected (hereinafter, first reflected image) from a first curved surface CS1, e.g., surface of the first optical lens LR1 closest to the eyeball E1, of the first optical lens LR1 may be reflected again from the first display module DM1. A first ghost image may be provided to the user through such a first ghost path. The first ghost image may have an inverted shape and a shifted color of the normal image.

A right schematic of FIG. 3A illustrates a second ghost path in which the normal image reflected (hereinafter, second reflected image) from a second curved surface CS2, e.g., a surface closest to the display module DM1, of the first optical lens LR1 may be reflected again from the first display module DM1. A second ghost image may be provided to the user through such a second ghost path. The second ghost image may be an image in which the shape and/or color are distorted from the normal image.

When the display module DM has a low reflectance the ghost images may be reduced or eliminated. When the display module DM has a high transmittance, brightness of the normal image may be increased, e.g., the display module exhibits a high light efficiency.

Separate members, e.g., a polarizing plate, to reduce reflectance that are attached to the display module DM are not suitable for being applied to the head mounted display device HMD. In particular, foreign substances may be introduced into a manufacturing and/or attachment of separate members that may be easily viewed due to the image being expanded through an optical lens to thereby serve as noise.

The display module according to an embodiment includes a destructive interference structure therein to decrease reflectance and increase light efficiency. The destructive interference structure may provide only the normal image without noise to the user. The destructive interference structure will be described in detail later.

Figure 4A:
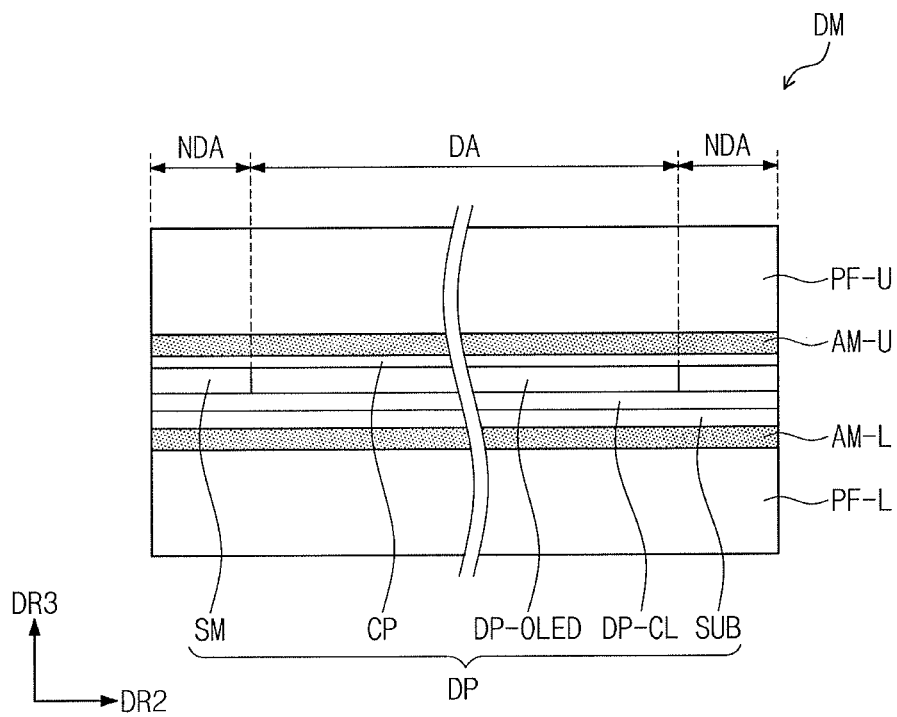
FIGS. 4A and 4B illustrate cross-sectional views of a display module according to an embodiment.
Figure 4B:
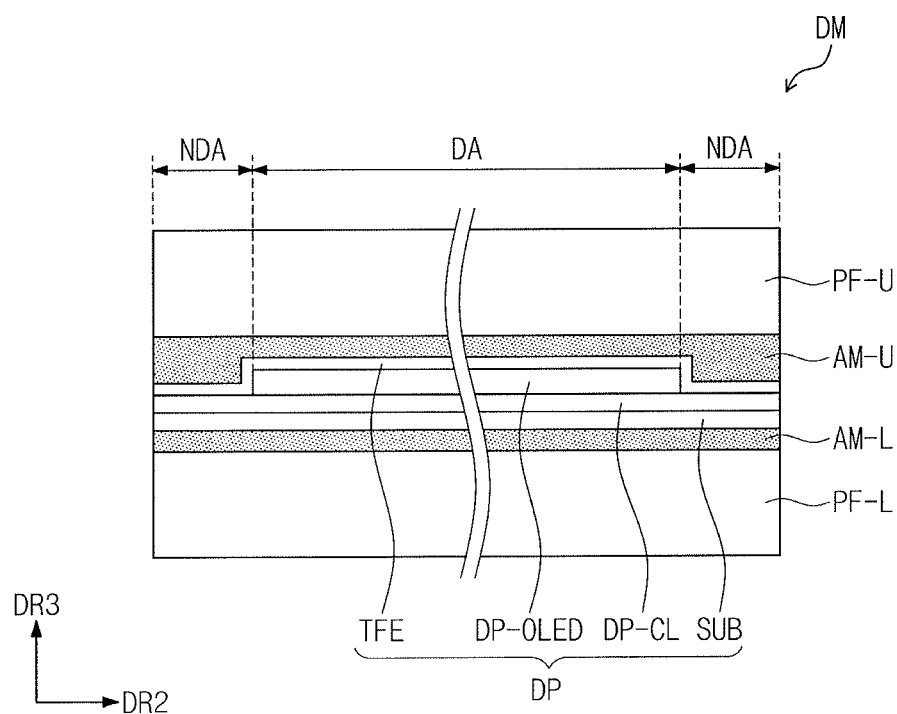

FIGS. 4A and 4B are cross-sectional views illustrating a display module DM according to embodiments.

As illustrated in FIG. 4A, the display module DM includes a display panel DP and protective films or members PF-U and PF-L. The protective members PF-U and PF-L may be provided in plurality. The display module DM may include a first or upper protective member PF-U on a first surface of the display panel DP and a second or lower protective member PF-L on a second surface, facing the first surface, of the display panel DP. The first protective member PF-U and the second protective member PF-L face each other in a third direction DR3 with the display panel DP therebetween. In the current embodiment, the display panel DP is to display an image through the first surface. In the current embodiment, the display module DM applied to a head mounted display device HMD is exemplarily described, but the display module DM may further include still another functional member according to types of applied electronic devices. For example, the display module DM may further include a touch detecting unit.

The first protective member PF-U and the display panel DP may be coupled through a first or upper adhesive member AM-U. The second protective member PF-L and the display panel DP may be coupled through a second or lower adhesive member AM-L. The protective members PF-U and PF-:L may include a plastic film including one of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and combinations thereof. Composition materials of the protective members PF-U and PF-L are not limited to plastic resins, but may include organic/inorganic composite materials. The protective members PF-U and PF-L may include a porous organic layer and an inorganic material filling the pores of the organic layer. The protective members PF-U and PF-L may have single-layer or multilayer structure.

Each of the first and second adhesive members AM-U and AM-L may be an optically clear adhesive film (OCA), an optically clear resin (OCR), a pressure sensitive adhesive film (PSA), or the like. Each of the first and second adhesive members AM-U and AM-L includes a photo-curable adhesive material or a thermosetting adhesive material, but materials are not limited thereto.

The display panel DP includes a base layer SUB, a circuit layer DP-CL disposed on the base layer SUB, a display element layer DP-OLED, and an encapsulating substrate CP.

The base layer SUB may include at least one plastic film. The base layer SUB may be a flexible substrate and may include a plastic substrate, a glass substrate, a metal substrate, an organic/inorganic composite material substrate, or the like.

The circuit layer DP-CL may include at least one intermediate insulating layer, a plurality of conductive layers, and a semiconductor layer. The plurality of conductive layers of the circuit layer DP-CL may serve as signal lines or pixel circuits. The pixel circuits may include thin film transistors and capacitors.

The display element layer DP-OLED may include, e.g., organic light-emitting diodes. The display element layer DP-OLED may include a destructive interference structure for removing ghost images described with reference to FIGS. 3A and 3B.

The encapsulating substrate CP encapsulates the display element layer DP-OLED. The encapsulating substrate CP may include a plastic substrate and/or a glass substrate. The encapsulating substrate CP and the circuit layer DP-CL may be coupled through a sealing material SM on a non-display region NDA in which images are not formed. In the current embodiment, the display element layer DP-OLED is only in a display region DA. Alternatively, the display element layer DP-OLED may be further in a portion of the non-display region NDA. The sealing material SM may couple the circuit layer DP-CL, the display element layer DP-OLED, and the encapsulating substrate CP.

Unlike the display panel DP illustrated in FIG. 4A, a display panel DP illustrated in FIG. 4B includes a thin film encapsulating layer TFE in place of the sealing member SM. The thin film encapsulating layer TFE may be directly formed on the display element layer DP-OLED or on a functional layer disposed on the display element layer DP-OLED. The thin film encapsulating layer TFE may be manufactured through a continuous process together with the display element layer DP-OLED. In particular, the thin film encapsulating layer TFE, may contact an upper surface of the display element layer DP-OLED in the display region DA, side surfaces of the display element layer DP-OLED in the non-display region NDA, and may contact the circuit layer DP-CL in the non-display region NDA. As such, a first adhesive member AM-U' may have a different thickness in a region in which the thin film encapsulating layer TFE contacts the circuit layer DP-CL.

The thin film encapsulating layer TFE may include at least one inorganic layer and at least one organic layer. The inorganic layers protect the display element layer DP-OLED from water/oxygen, and the organic layers protect the display element layer DP-OLED from foreign substances such as dust particles.

Figure 5A:
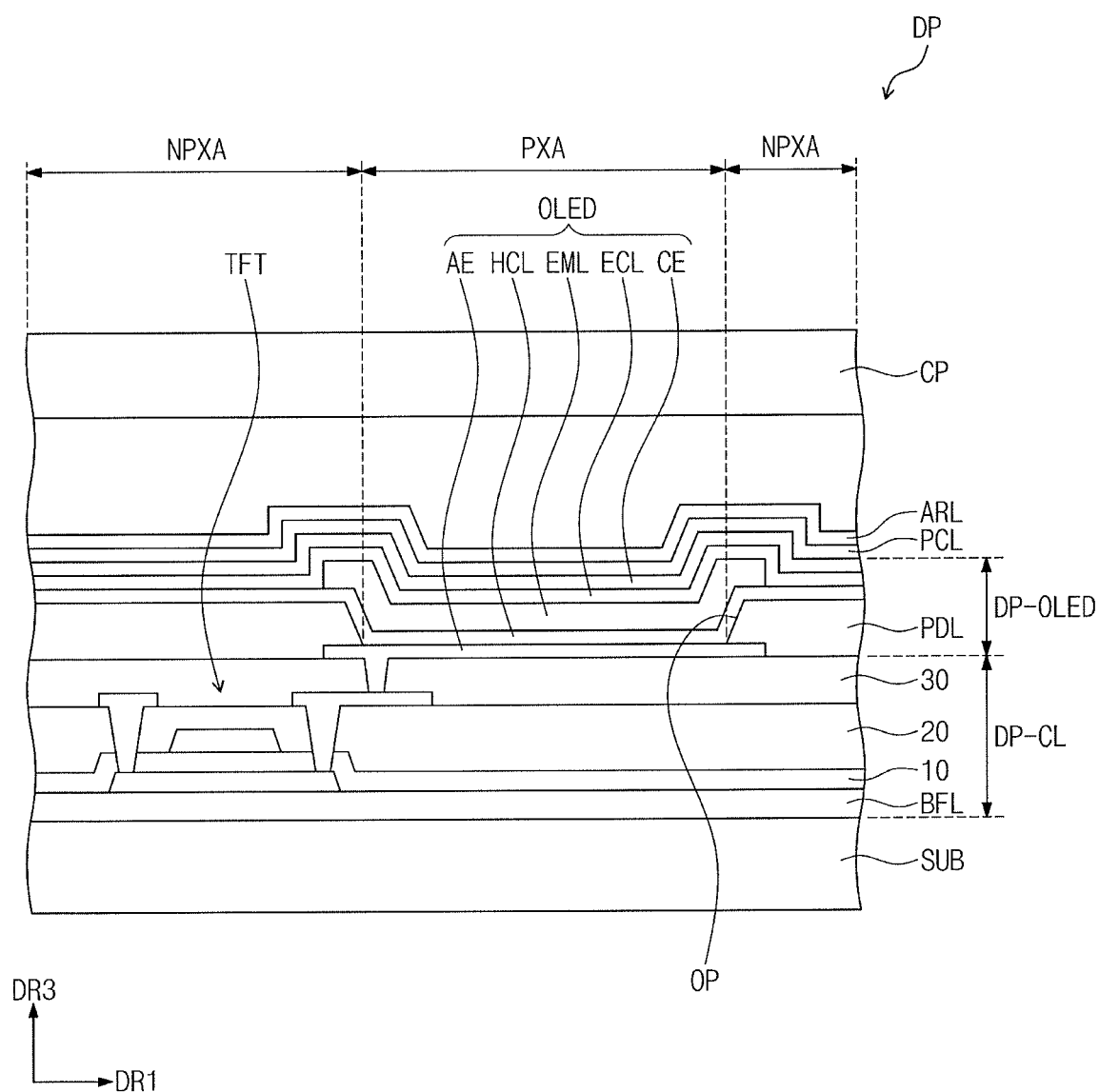
FIG. 5A illustrates a cross-sectional view of a display panel according to an embodiment.
Figure 5B:
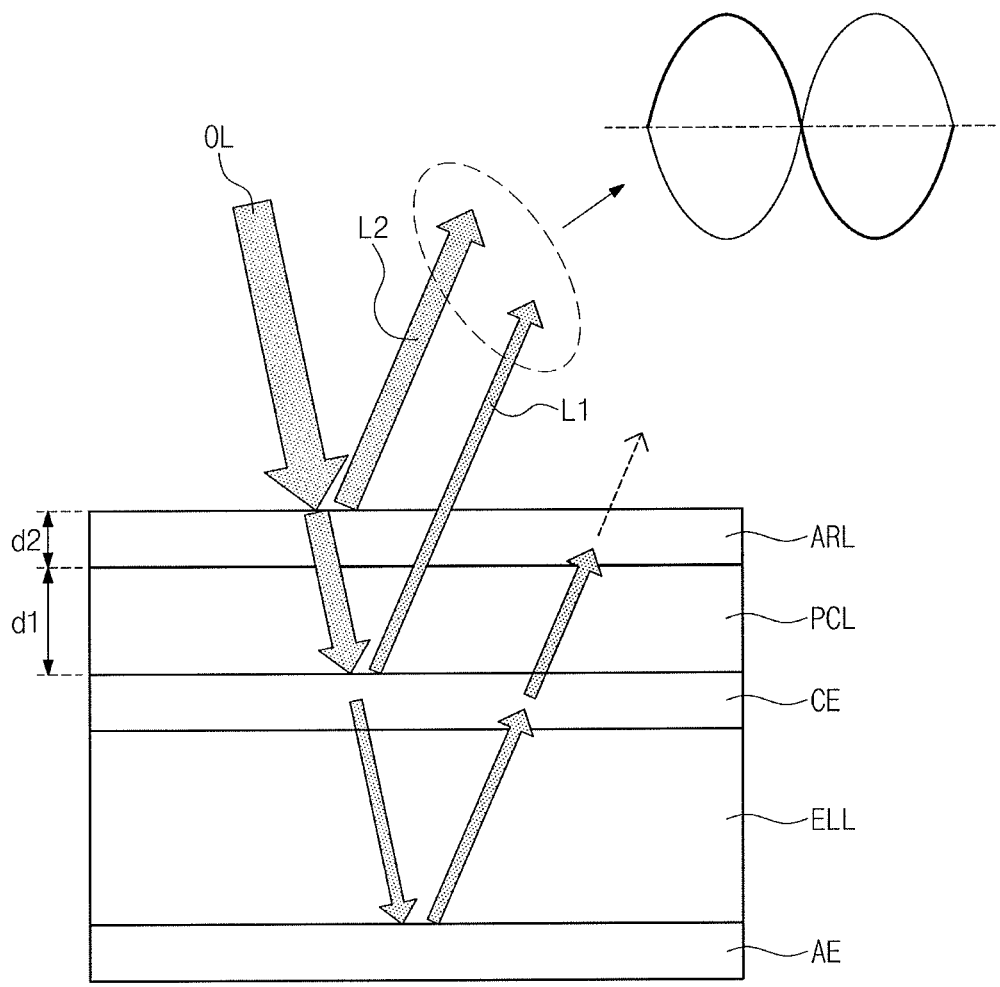
FIG. 5B illustrates a cross-sectional view of a path of destructive interference of light reflected from a display panel according to an embodiment.

FIG. 5A illustrates a cross-sectional view of a display panel DP according to an embodiment. FIG. 5B illustrates a cross-sectional view of a path of destructive interference of light reflected from a display panel DP according to an embodiment.

As illustrated in FIG. 5A, the circuit layer DP-CL is on the base layer SUB. The circuit layer DP-CL may include a plurality of insulating layers BFL, 10, 20 and 30 and a thin-film transistor TFT. Each of the plurality of insulating layers BFL, 10, 20 and 30 may include an organic material and/or inorganic materials, and may have a single-layered or multilayer structure. Some of the plurality of insulating layers BFL, 10, 20 and 30, for example, a buffer layer BFL may not be provided, and another insulating layer may be further provided.

A display element layer DP-OLED may be on the circuit layer DP-CL. The display element layer DP-OLED may include a pixel defining layer PDL and an organic light-emitting diodes OLED. When viewed in a plane, the display panel DP may be divided into a light-emitting region or pixel area PXA that includes organic light-emitting diodes and a non-light-emitting region or non-pixel area NPXA adjacent to the light-emitting region PXA. An opening part OP of the pixel defining layer PDL exposes at least a portion of a first electrode AE. The opening part OP of the pixel defining layer PDL may correspond to the light-emitting region PXA, e.g., they may overlap in the third direction DR3.

The organic light-emitting diodes OLED may include a first or anode electrode AE, a second or cathode electrode CE, and a light-emitting function layer between the first electrode AE and the second electrode CE. In the current embodiment, the top-emission type organic light-emitting diodes OLED which emits light toward the second electrode CE are exemplarily described. The second electrode CE is more adjacent, e.g., closer to, the optical lens LR1 (see FIG. 3A) than the first electrode AE.

FIG. 5A illustrates a light-emitting function layer including a first charge control layer HCL, light-emitting layer EML and a second charge control layer ECL, but the laminated structure of the light-emitting function layer is not limited thereto. In FIG. 5B, the light-emitting function layer ELL is illustrated as a single layer. It is sufficient that the light-emitting function layer ELL include a light-emitting layer EML. The light-emitting layer EML may include an organic light-emitting material in which a host and a dopant is mixed and/or an inorganic light-emitting material, such as semiconductor nano-crystals (e.g. a quantum dots, quantum rods, quantum tubes). The first charge control layer HCL and the second charge control layer ECL respectively inject and/or transport charges corresponding to electrons and holes. Although not separately shown, the light-emitting function layer ELL and the second electrode CE may be disposed in common in the plurality of light-emitting regions PXA and the non-light-emitting regions NPXA adjacent to the light-emitting regions PXA.

The first electrode AE may include a reflective layer. For example, the reflective layer may include at least one of silver (Ag), magnesium (Mg), aluminum (Al), platinum (Pt), palladium (Pd), gold (Au), nickel (Ni), neodymium (Nd), Iridium (Ir), and chromium (Cr). The first electrode AE may include a transparent or semi-transparent layer formed of at least one indium tin oxide (ITO), indium zinc oxide (IZO), zinc oxide (ZnO), indium oxide ($In_2O_3$), indium gallium oxide (IGO) and aluminum zinc oxide (AZO). In the current embodiment, the first electrode AE may include three layers of ITO/Ag/ITO.

The second electrode CE may include a conductive material having a high reflectance and a small absorption. The second electrode CE may be a semi-transparent electrode to form a resonant structure with the first electrode AE. The second electrode CE may include a conductive material for which the product of the refractive index and the extinction ratio is about 1 to about 10 in the visible light range. For example, the second electrode CE may include one or more of Ag, Al, Yb, Ti, Mg, Ni, Ca, Cu, LiF/Ca, LiF/Al, MgAg and CaAg.

A phase control layer PCL is on the second electrode CE, and a reflection preventing layer ARL is on the phase control layer PCL. In the current embodiment, the combination of the second electrode CE, the phase control layer PCL, and the reflection preventing layer ARL is defined as a destructive interference structure.

The phase control layer PCL adjusts the optical distance between the second electrode CE and the reflection preventing layer ARL to generate destructive interference between the light reflected from the second electrode CE and the light reflected from the reflection preventing layer ARL.

The phase control layer PCL may include at least one of $SiN_x$, $SiO_2$, SiCN, LiF, $MgF_2$, $CaF_2$, SiON, $Ta_xO_y$, and $TiO_x$, may be a transparent thin film, and is not limited thereto. The phase control layer PCL may also include a material which is the same as the first charge control layer HCL or the second charge control layer ECL. For example, the phase control layer PCL may include a hole transporting material HT01.

The reflection preventing layer ARL may include a conductive material for which a product of the refractive index and the extinction ratio is about 1 to about 6 in the visible light range. For example, the reflection preventing layer ARL may include at least one of Cr, molybdenum (Mo), titanium (Ti), cobalt (Co), Ni, Al, tungsten (W), manganese (Mn), tellurium (Te), $Ni_xP$, $CrN_x$, $TiN_x$, $TiAlN_x$, $MoO_x$, and $CuO_x$, where x is a natural number satisfying a chemical formula. The reflection preventing layer ARL may include a material which has a lower reflectance and a relatively higher light absorption than the second electrode CE. The above-mentioned materials may be formed through a sputtering deposition method or a thermal deposition method. In particular, Mn, Te, and $Ni_2P$ may have an improved thin film characteristic when formed through the thermal deposition method than through the sputtering deposition method.

The encapsulating substrate CP may be spaced apart from the reflection preventing layer ARL. A medium having a predetermined refractive index may be disposed between the encapsulating substrate CP and the reflection preventing layer ARL. The medium may be air, another gas, or a sealing material.

Referring to FIG. 5B, among the light OL (hereinafter, referred to as incident light) incident from the outside, light reflected from the second electrode CE and light reflected from the reflection preventing layer ARL are subject to destructive interference. Although FIG. 5B describes the incident light OL in terms of one pixel, the incident light OL correspond to the reflected image described with reference to FIGS. 3A and 3B. Light beams formed in the pixels are combined in a plane, thereby defining an image.

The phase control layer PCL adjusts the optical distance between the second electrode CE and the reflection preventing layer ARL such that the phase difference between a first reflected beam L1, which is reflected at an interface between the phase control layer PCL and the second electrode CE, and a second reflected beam L2, which is reflected at an interface between the medium and the reflection preventing layer ARL, is about 160° to about 200° to cause destructive interference.

An optical thickness d1 of the phase control layer PCL and an optical thickness d2 of the reflection preventing layer ARL are set such that the phase difference between the first and second reflected beams L1 and L2 is about 180°. In the following Equation 1, λ is the wavelength of the incident light OL, n1 is the refractive index of the phase control layer PCL, and n2 is the refractive index of the reflection preventing layer ARL.

$$(n1 \times d1) + (n2 \times d2) = \frac{\lambda}{4}$$ [Equation 1]

FIG. 5C is a comparison table illustrating light efficiency of a destructive interference structure according to an embodiment. FIG. 5D is a comparison table illustrating reflectance of the destructive interference structure according to an embodiment.

FIGS. 5C and 5D respectively illustrate light efficiency and reflectance of a display module (the current embodiment) which includes a destructive interference structure in comparison with a display module (comparative example) which includes a polarizing plate. In FIGS. 5C and 5D, when the measured result is better in the current embodiment than the comparative, example, cells in the table are shaded.

The display module of the current embodiment includes the single-layered second electrode CE in which Ag and Mg are co-deposited and the reflection preventing layer ARL is a single Mn layer. A composition ratio of Ag and Mg is about 10:1.

Light efficiency is measured for different thickness of the second electrode CE and the reflection preventing layer ARL. As illustrated in FIG. 5C, when the reflection preventing layer ARL has a thickness of about 20 angstrom to about 135 angstrom while the second electrode CE has a thickness of about 70 angstrom to about 245 angstrom, light efficiency is higher than that in comparative example.

As illustrated in FIG. 5D, when the reflection preventing layer ARL has a thickness of about 48 angstrom to about 258 angstrom while the second electrode CE has a thickness of about 70 angstrom to about 245 angstrom, reflectance is lower than that in the comparative example.

Referring to FIGS. 5C and 5D, when the reflection preventing layer ARL has a thickness of about 48 angstrom to about 135 angstrom while the second electrode CE has a thickness within the range of about 70 angstrom to about 245 angstrom, light efficiency is higher than that in the comparative example, and the reflectance is lower than that n the comparative example.

Figure 5E:
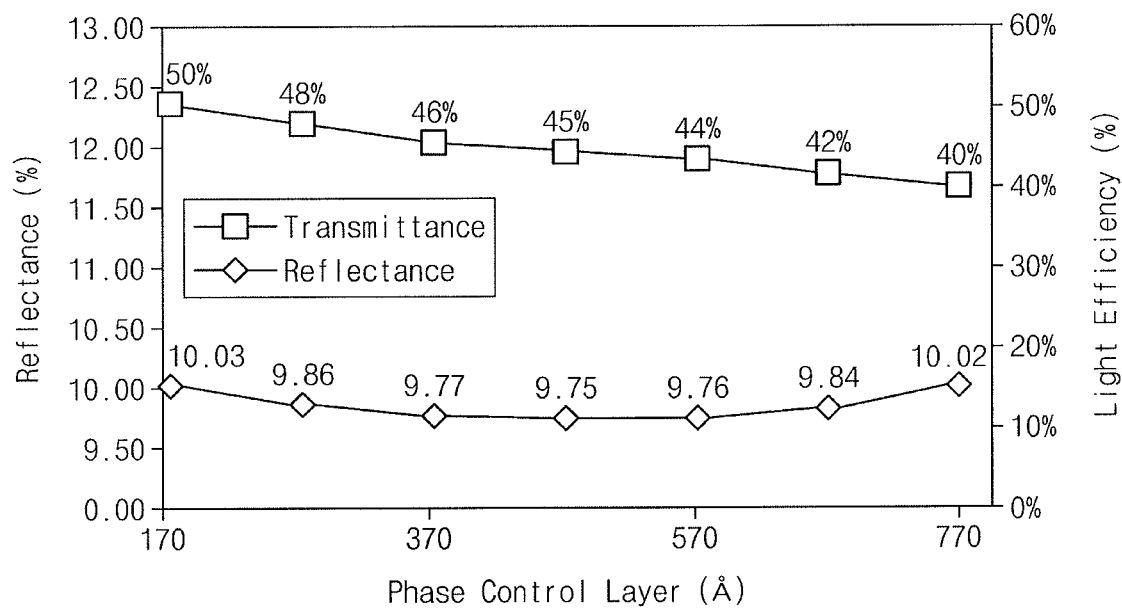
FIG. 5E illustrates a graph illustrating light efficiency and reflectance according to the thickness of a phase control layer of a destructive interference structure according to an embodiment.

FIG. 5E is a graph illustrating light efficiency and reflectance according to the thickness of a phase control layer PCL of a destructive interference structure according to an embodiment. FIG. 5E respectively illustrates light efficiency and reflectance of a display module (the current embodiment) which includes a destructive interference structure in comparison with a display module (comparative example) which does not include a polarizing plate.

In the current embodiment, a phase control layer PCL includes a hole transport material HT01. The phase control layer including HT01 has a refractive index of about 1.9. According the current embodiment, the phase control layer PCL has transmittance of about 45% at a thickness of about 500 angstrom. This is very similar level to the transmittance of the display module including a polarizing plate. In the current embodiment, the phase control layer may have a thickness of lower than about 500 angstrom in order to have transmittance higher than that of the display module including a polarizing plate.

Figure 6A:
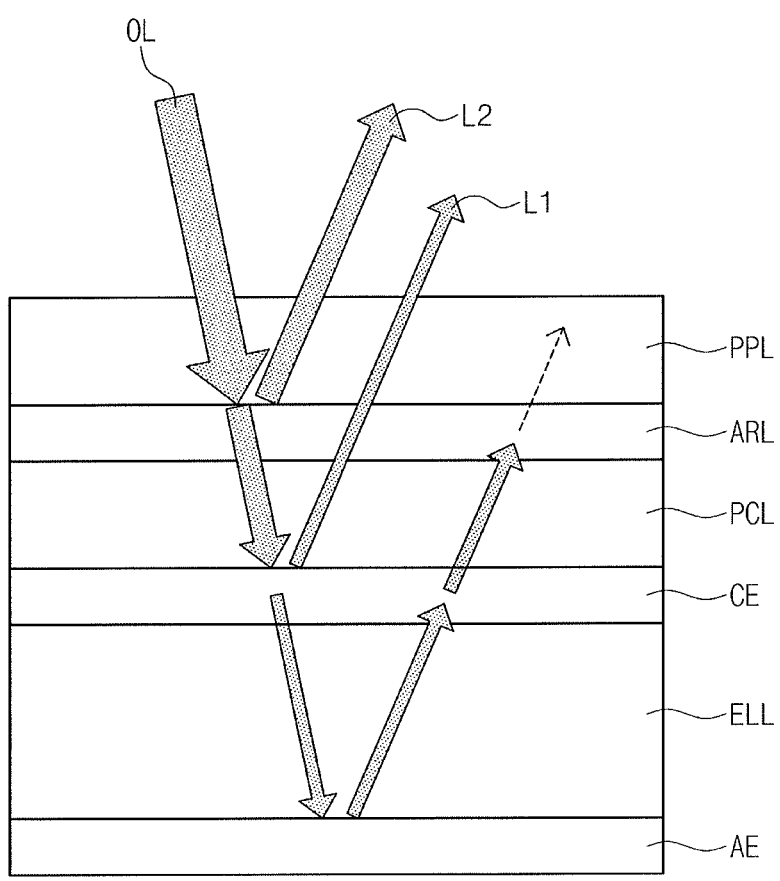
FIG. 6A illustrates a cross-sectional view of a portion of a display panel according to an embodiment.
Figure 6B:
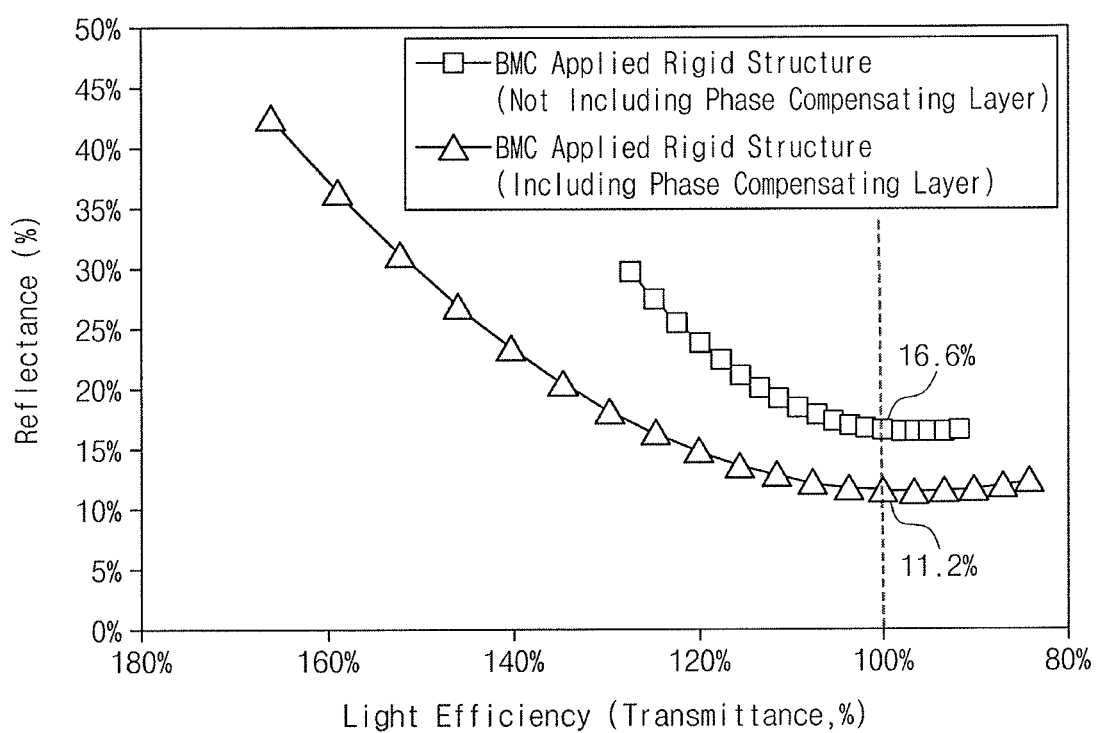
FIG. 6B illustrates a graph illustrating reflectance vs. light efficiency of a display panel according to an embodiment.
Figure 6C:
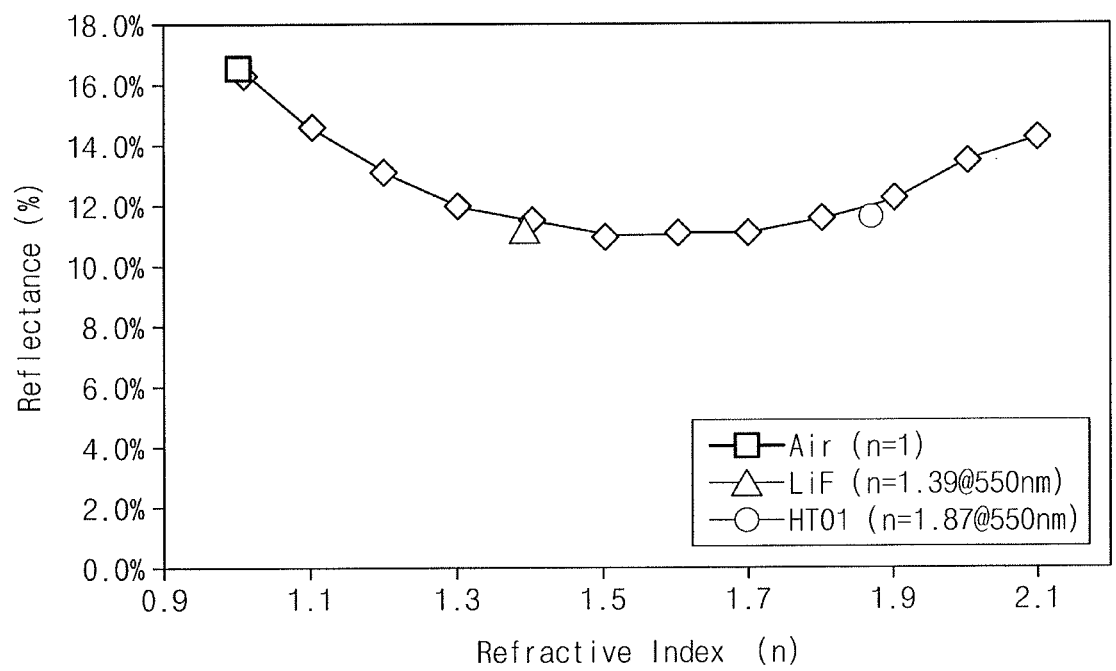
FIG. 6C illustrates a graph of a refractive index vs. reflectance of a phase compensating layer illustrated in FIG. 6A.
Figure 6D:
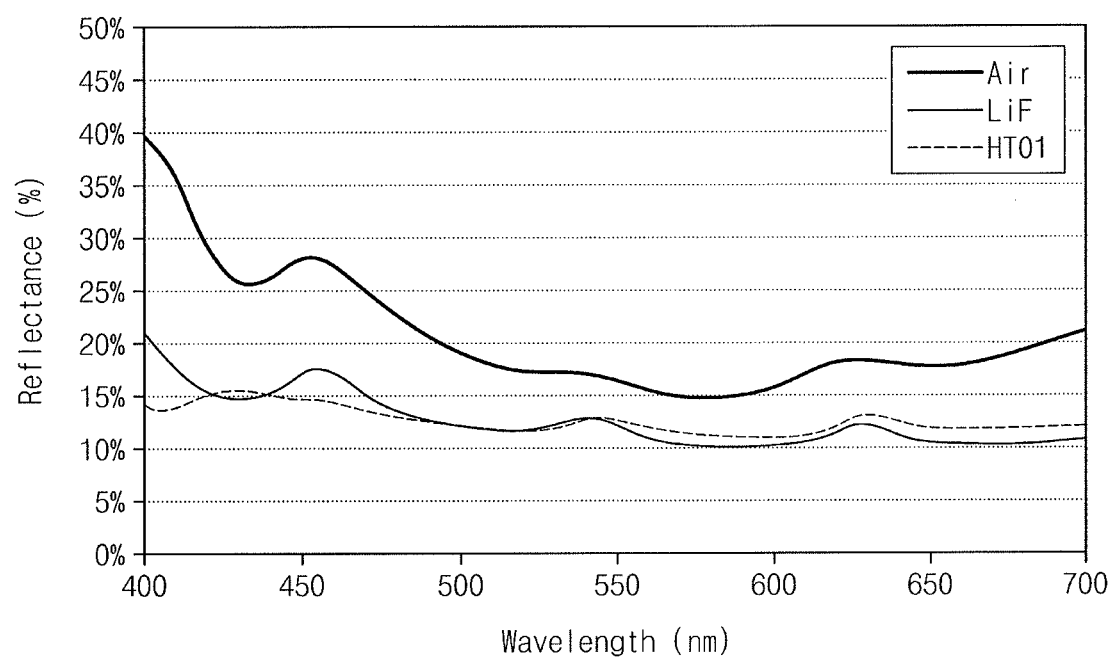
FIG. 6D illustrates a graph of reflectance according to the wavelength of light reflected from the display panel illustrated in FIG. 6A.

FIG. 6A is a cross-sectional view of a portion of a display panel DP according to an embodiment. FIG. 6B is a graph illustrating reflectance vs. light efficiency of a display panel DP according to an embodiment. FIG. 6C is a graph illustrating a refractive index vs. reflectance of a phase compensating layer PPL illustrated in FIG. 6A. FIG. 6D is a graph illustrating reflectance according to the wavelength of light reflected from the display panel illustrated in FIG. 6A. Hereinafter, the detailed description on the same configuration as that described with reference to FIGS. 1 to 5E will not be repeated.

As illustrated in FIG. 6A, a display panel DP may further include a phase compensating layer PPL on the reflection preventing layer ARL. The refractive index of the phase compensating layer PPL is less than that of the reflection preventing layer ARL and greater than that of a medium disposed between the phase compensating layer PPL and an encapsulating substrate CP (see FIG. 5A)

The phase compensating layer PPL having a refractive index within the range of the refractive indexes of the medium and the reflection preventing layer ARL to thereby compensate a phase. The phase compensating layer PPL compensates the phases of a first reflected beam L1 and a second reflected beam L2 such that the phase difference between the first reflected beam L1 and the second reflected beam L2 is about 180°.

FIG. 6B illustrates reflectance of a display panel DP according to existence of a phase compensating layer PPL. The horizontal axis represents light efficiency of a display panel DP according to the current embodiment versus a display panel including a phase control layer PCL and not including a phase compensating layer PPL. When the phase compensating layer PPL is included, reflectance is decreases by about 5% under the same light efficiency, e.g., light efficiency of about 100%, as the display panel including just the phase control layer PCL.

FIG. 6C illustrates reflectance according to the refractive index of a phase compensation layer PPL. Reflectance is measured for light with wavelength of about 550 nm. Here, the phase compensating layer PPL has a low reflectance at a refractive index of about 1.5 to about 1.7. At a wavelength 550 nm, LiF has reflectance of about 11% and HT01 has a reflectance of about 12%.

The applicability of a material to the phase compensating layer PPL is determined according to the refractive index of the material. To decrease reflectance, a material having a refractive index greater than about 1.0 and less than about 2.0 may be used as the phase compensating layer PPL. As long the material has a refractive index within the above-mentioned range, materials other than LiF or HT01 may be used for the phase compensating layer.

In determining a material suitable for the phase compensating layer PPL, not only the above-mentioned reflectance but also reflectance distribution over entire wavelength band is considered. Referring to FIG. 6D, it may be found that a LiF phase compensating layer PPL and HT01 phase compensating layer PPL decrease reflectance over entire wavelength band. Any material having a deviation in reflectance of about 15% or less between the lowest reflectance and the highest reflectance may be used. Accordingly, reflected light does not have a specific color.

Figure 7A:
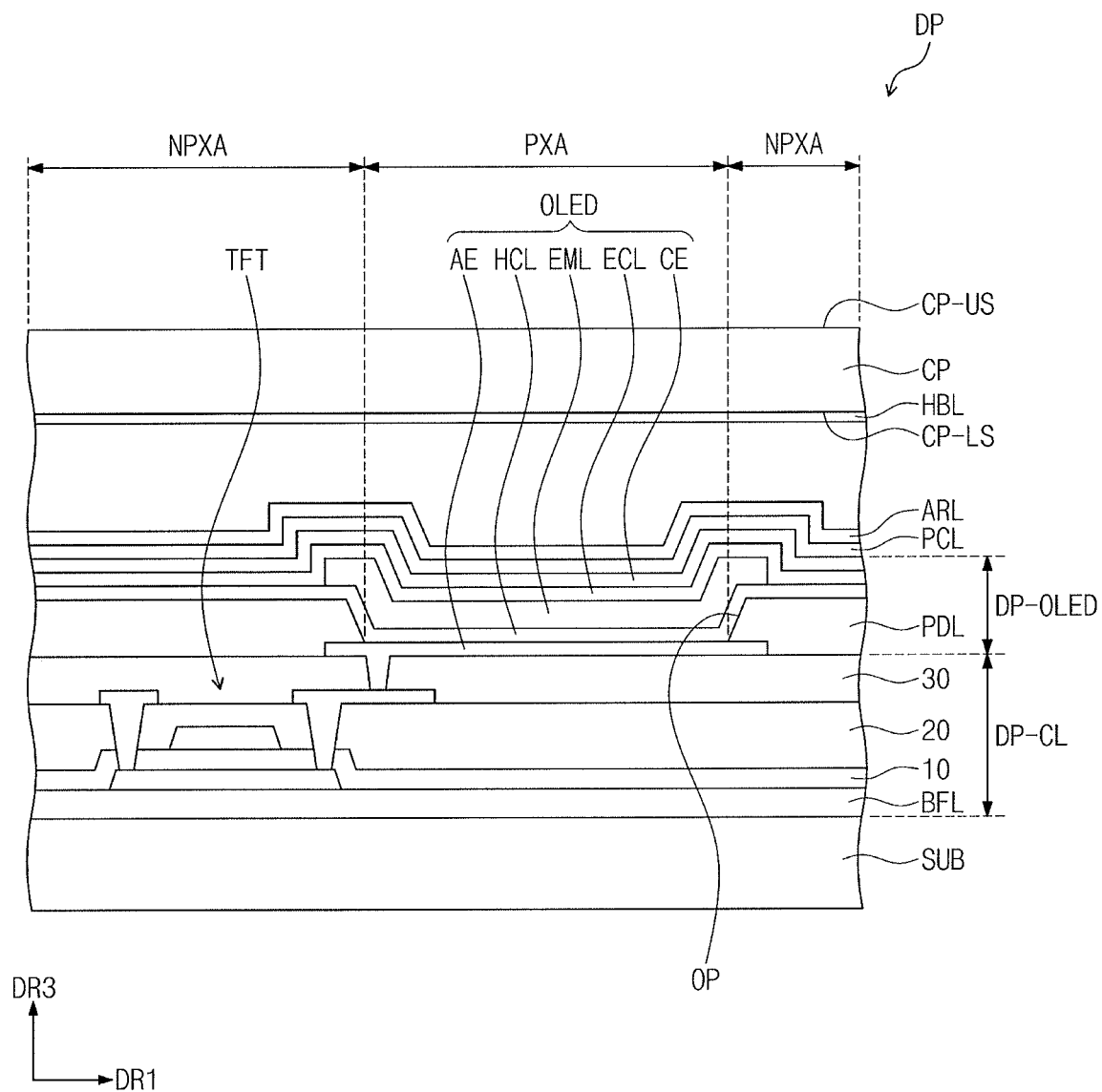
FIG. 7A illustrates a cross-sectional view of a display panel according to an embodiment.

FIG. 7A is a cross-sectional view of a display panel DP according to an embodiment. FIG. 7B is an enlarged cross-sectional view illustrating the hybrid layer HBL illustrated in FIG. 7A. Hereinafter, the detailed description on the same configuration as that described with reference to FIGS. 1 to 6D will not be repeated.

As illustrated in FIG. 7A, a hybrid layer HBL may be on a lower surface CP-LS of an encapsulating substrate CP, e.g., at an interface between the medium and the encapsulating substrate CP. The lower surface CP-LS of the encapsulating substrate CP is disposed further from an optical lens LR1 (see FIG. 3A) than the upper surface CP-US of the encapsulating substrate CP. A hybrid layer HBL may decrease the amount of light reflected from the lower surface CP-LS of the encapsulating substrate CP. Light beams reflected from the lower surface CP-LS of the encapsulating substrate CP and the light beams reflected from layers SL1 to SL4 of the hybrid layer HBL may be subject to a destructive interference.

As illustrated in FIG. 7B, the hybrid layer HBL may include first refractive index layers and second refractive index layers, having refractive indexes different from those of the first refractive index layers. Each of the first refractive index layers may include one of a silicon oxide layer, a silicon oxynitride layer, and a silicon nitride layer, and each of the second refractive index layers includes a different one of a silicon oxide layer, a silicon oxynitride layer, and a silicon nitride layer.

FIG. 7B exemplarily illustrates a glass substrate as an encapsulating substrate CP. FIG. 7B illustrates three hybrid layers HBL including two silicon nitride layers and two silicon oxide layers which are alternately laminated. It is described that first to third layers (SL1 to SL3) of the three hybrid layers HBL have the same materials and thicknesses. However, embodiments are not limited thereto, and the first to third layers (SL1 to SL3) of the three hybrid layers HBL may be selected so as to be different from each other.

Figure 8A:
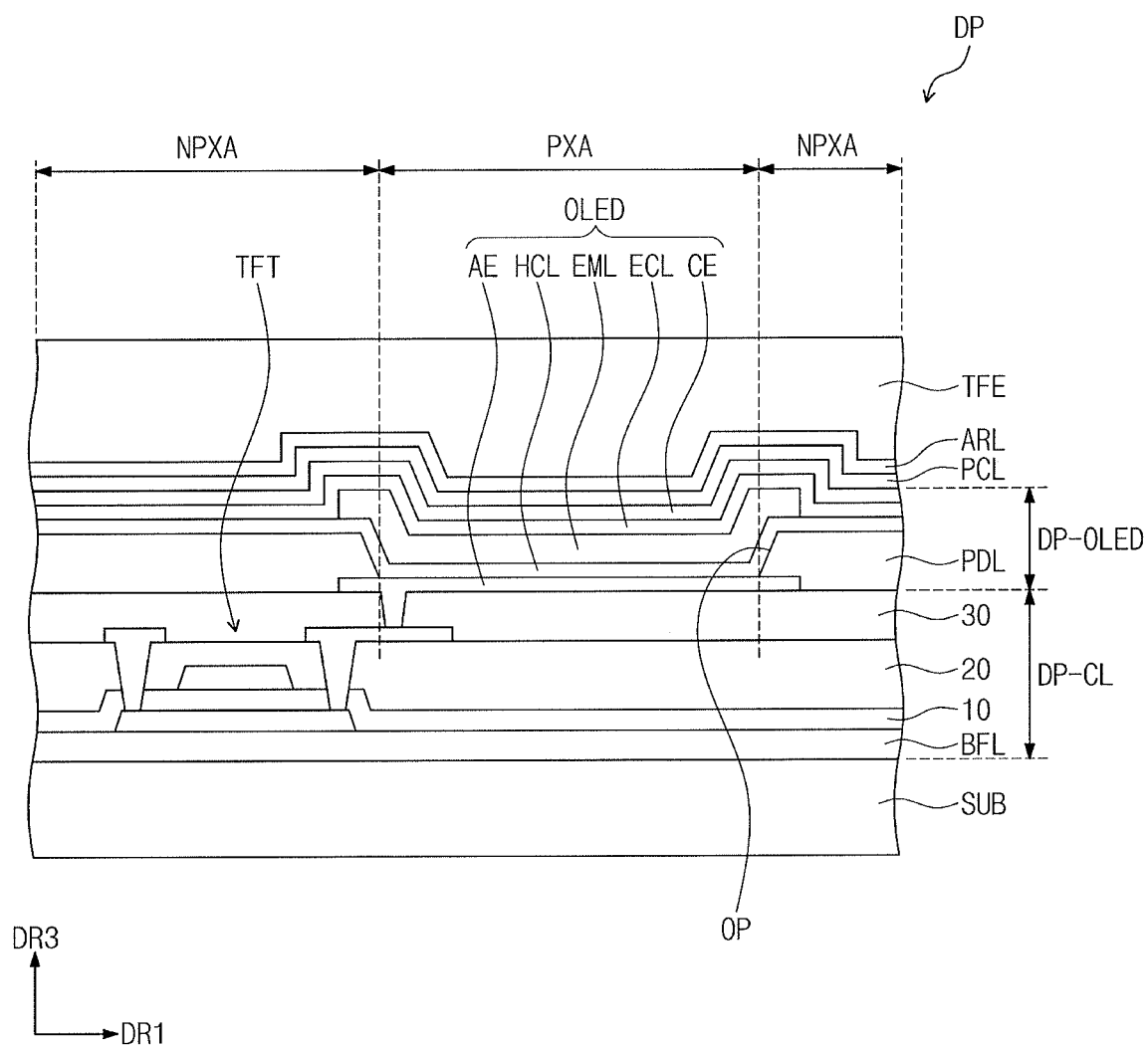
FIG. 8A illustrates a cross-sectional view of a display panel according to an embodiment.
Figure 8B:
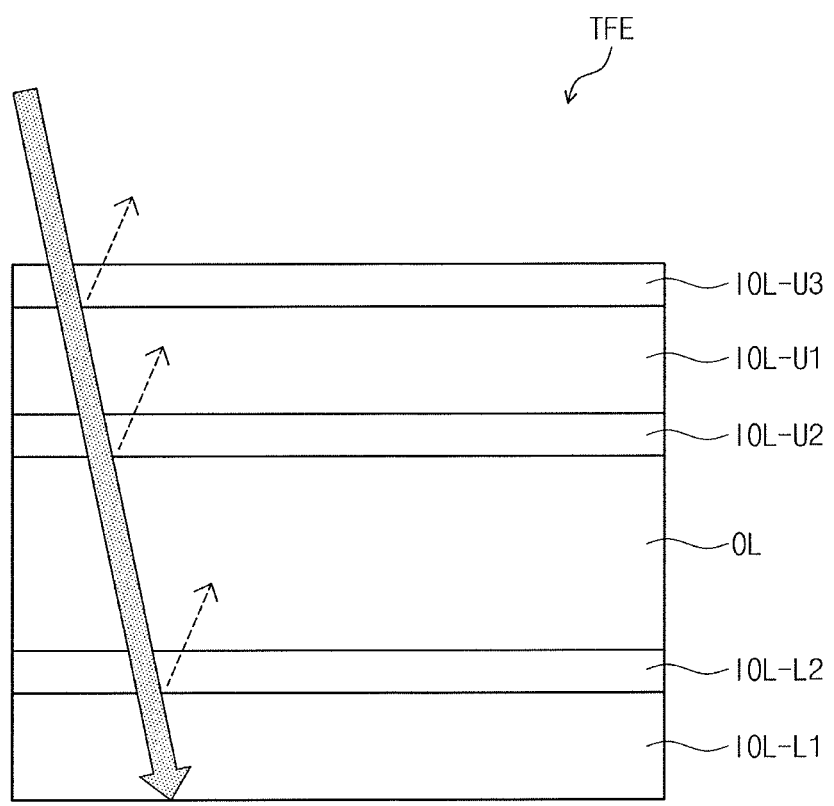
FIG. 8B illustrates an enlarged cross-sectional view illustrating the thin film encapsulating layer illustrated in FIG. 8A.
Figure 8C:
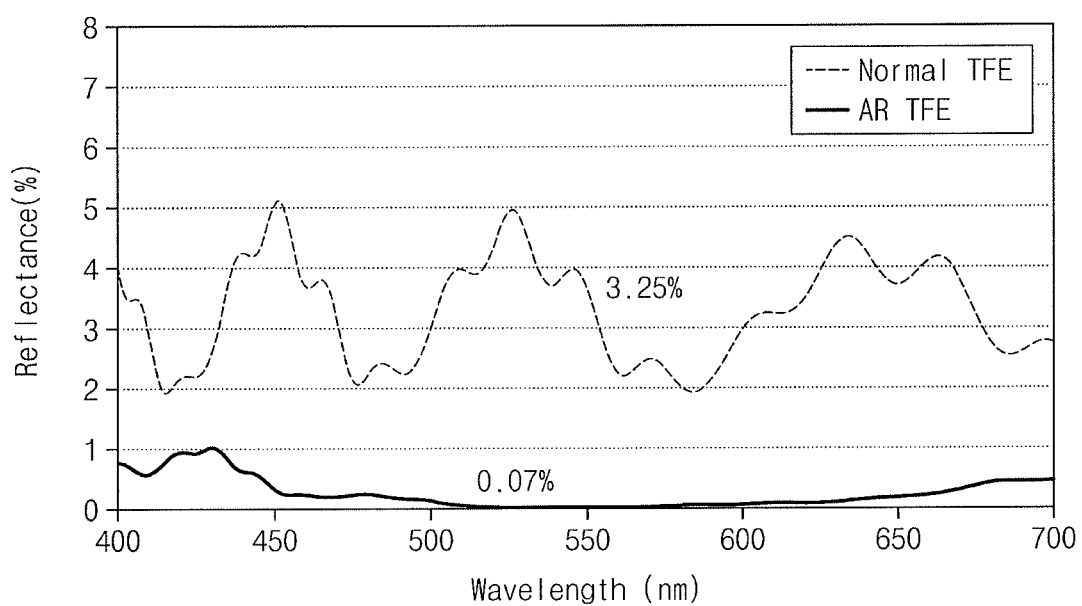
FIG. 8C illustrates a graph of reflectance according to wavelengths of light reflected from the display panel.

Each of a first silicon nitride layer SL1 which is most adjacent a lower surface CP-LS, e.g., closest in a stacking direction or third direction DR3, to a lower surface CP-LS and a first silicon oxide layer SL2 adjacent to the first silicon nitride layer SL1, e.g., closest in a stacking direction or third direction DR3, to the first silicon nitride layer SL1, may have a thickness of about 200 angstrom. A second silicon nitride layer SL3 adjacent to e.g., closest in a stacking direction or third direction DR3, the first silicon oxide layer SL2 may have a thickness of about 900 angstrom. The three hybrid layers HBL may include second silicon oxide layers SL4 which have thicknesses different from each other in different embodiments. The decreasing amount of reflectance may vary according to the thicknesses of the second silicon oxide layers SL4, e.g. may decrease with increasing thickness, as shown in FIG. 7B FIG. 8A is a cross-sectional view of a display panel DP according to an embodiment. FIG. 8B is an enlarged cross-sectional view of the thin film encapsulating layer illustrated in FIG. 8A. FIG. 8C is a graph illustrating reflectance according to wavelengths of light reflected from the display panel DP. Hereinafter, the detailed description on the same configuration as the configuration described with reference to FIGS. 1 to 6D will not be repeated.

A display panel DP according to the current embodiment includes a thin film encapsulating layer TFE replacing an encapsulating substrate CP. The display panel DP according to the current embodiment may be applied to electronic devices other than a head mounted display device HMD, e.g., flexible electronic devices such as foldable mobile terminals.

FIGS. 8A and 8B illustrate the display panel DP illustrated in FIG. 4B in an expanded view. The thin film encapsulating layer TFE may include an organic layer OL, at least one or more lower inorganic layers IOL-L1 and IOL-L2 between the reflection preventing layer ARL and the organic layer OL, and at least one or more upper inorganic layers IOL-U1, IOL-U2, and IOL-U3 on the organic layer OL. The at least one or more lower inorganic layers IOL-L1 and IOL-L2 and the at least one or more upper inorganic layers IOL-U1, IOL-U2, and IOL-U3 may each have refractive indexes greater than the organic layer OL. The refractive index of the organic layer OL may be about 1.4 to about 1.6. The refractive indexes of the lower inorganic layers IOL-L1 and IOL-L2 and the refractive indexes of the upper inorganic layers IOL-U1, IOL-U2 and IOL-U3 may be about 1.6 to about 2.2. Even though having the above-mentioned range, the organic layer OL is selected so as to have refractive index different from those of the lower inorganic layers IOL-L1 and IOL-L2 and those of the upper inorganic layers IOL-U1, IOL-U2 and IOL-U3. When the refractive indexes of the lower inorganic layers IOL-L1 and IOL-L2 and the refractive indexes of the upper inorganic layers IOL-U1, IOL-U2 and IOL-U3 are about 1.6, the organic layer OL has a refractive index less than about 1.6.

The lower inorganic layers IOL-L1 and IOL-L2 may include a first lower inorganic layer IOL-L1 having a first refractive index between a reflection preventing layer ARL and the organic layer OL, and a second lower inorganic layer IOL-L2 having a second refractive index less than the first refractive index between the first lower inorganic layer IOL-L1 and the organic layer OL. The upper inorganic layers IOL-U1, IOL-U2, and IOL-U3 may include a first upper inorganic layer IOL-U1 having the first refractive index on, e.g., directly on, the organic layer OL, and a second upper inorganic layer IOL-U2 having the second refractive index less than the first refractive index between the first upper inorganic layer IOL-U1 and the organic layer OL.

The second lower inorganic layer IOL-L2 may include more oxygen atoms in the same volume than the first lower inorganic layer IOL-L1. Accordingly, the refractive index of the second lower inorganic layer IOL-L2 is decreased. The first lower inorganic layer IOL-L1 and the second lower inorganic layer IOL-L2 may be formed through the same deposition process, but under different deposition conditions. For example, a partial pressure of oxygen when the first lower inorganic layer IOL-L1 is formed may be increased with respect to that when the second lower inorganic layer IOL-L2 is formed. Each of the first and second lower inorganic layers IOL-L1 and IOL-L2 may be silicon oxynitride.

The refractive index of the first lower inorganic layer IOL-L1 may be about 1.68, and the refractive index of the second lower inorganic layer IOL-L2 may be about 1.65. However, embodiments are not limited thereto, and the different refractive indexes of the lower inorganic layers IOL-L1 and IOL-L2 may be selected within the range of the refractive indexes of the lower inorganic layers IOL-L1 and IOL-L2, and the upper inorganic layers IOL-U1, IOL-U2, and IOL-U3.

The second upper inorganic layer IOL-U2 may include more oxygen atoms in the same volume than the first upper inorganic layer IOL-U1. The first upper inorganic layer IOL-U1 may be silicon nitride, and the second upper inorganic layer IOL-U2 may be silicon oxynitride. The refractive index of the first upper inorganic layer IOL-U1 may be about 1.93 and the refractive index of the second upper inorganic layer IOL-U2 may be about 1.65.

The second lower inorganic layers IOL-L2 may be thinner along the third direction DR3 than the first lower inorganic layer IOL-L1. The second upper inorganic layers IOL-U2 may be thinner than the first upper inorganic layer IOL-U1. This is because while the first lower inorganic layer IOL-L1 and the first upper inorganic layer IOL-U1 have a capping function, it is sufficient that an interface in which the refractive indexes gradually vary is further formed in the second lower inorganic layer IOL-L2 and the second upper inorganic layer 101-U2. The thickness of each of the second lower inorganic layers IOL-L2 and the second upper inorganic layer 101-U2 may be about 100 angstroms to about 1000 angstroms, e.g., about 500 angstroms to about 1000 angstroms. The thickness of the first lower inorganic layer IOL-L1 and the first upper inorganic layer IOL-U1 may be several thousand angstroms.

The upper inorganic layers IOL-U1, IOL-U2, and IOL-U3 may further include a third upper inorganic layer IOL-U3 on the first upper inorganic layer IOL-U1. The third upper inorganic layer IOL-U3 may have a refractive index less than the first upper inorganic layer IOL-U1. The third upper inorganic layers IOL-U3 may have the same material as the second upper inorganic layer IOL-U2. Although not separately shown, an adhesive layer having a refractive index less than the third upper inorganic layer IOL-U3 may be further disposed on the third upper inorganic layer IOL-U3.

The thin film encapsulating layer TFE according to the current embodiment includes lower inorganic layers IOL-L1 and IOL-L2 with a multi-layer structure in which the layers have refractive indexes different from each other, and upper inorganic layers IOL-U1, IOL-U2, and IOL-U3 with a multi-layer structure in which the layers have refractive indexes different from each other, thereby having reduced reflectance. Table 1 below shows the result of comparing the reflectance of a thin film encapsulating layer (comparative example) including only the organic layer OL, the first lower inorganic layer IOL-L1, and the first upper inorganic layer IOL-U1 with that of the thin film encapsulating layer illustrated in FIG. 8B. In the current embodiment, it is assumed that the third upper inorganic layer IOL-U3 is not provided.

TABLE 1

|  | Interface surface reflectance |  | Total reflectance |
| --- | --- | --- | --- |
| Comparative example | R(IOL-L1:OL) | 0.218 | 1.558 |
|  | R(OL:IOL-U1) | 1.34 |  |
| Current embodiment | R(IOL-L1:IOL-L2) | 0.008 | 0.8958 |
|  | R(OL-L2:OL) | 0.142 |  |
|  | R(OL:IOL-U2) | 0.142 |  |
|  | R(OL-U2:IOL-U1) | 0.611 |  |

Reflectance at each interface surface is calculated by Equation 2 below. Here, n1 means the refractive index of the lower layer in a double layer structure, and n2 means the refractive index of the upper layer in the double layer structure. In Table 1 above, the interface surface reflectance was calculated by Equation 2 below.

$$Rif = \left(\frac{n1-n2}{n1+n2}\right)^2 \quad \text{[Equation 2]}$$

The thickness of the second lower inorganic layer IOL-L2 and the second upper inorganic layer IOL-U2, and the refractive index of and the second upper inorganic layer IOL-U2 may be selected to further decrease the reflectance.

The reflectance in a continuously laminated three-layered structure may be calculated by Equation 3 below.

$$Rth = \frac{n2^2(n1-n3)^2\cos^2\left(\frac{2\pi}{\lambda}d2\right) + (n1n3-n2^2)^2\sin^2\left(\frac{2\pi}{\lambda}d2\right)}{n2^2(n1+n3)^2\cos^2\left(\frac{2\pi}{\lambda}d2\right) + (n1n3+n2^2)^2\sin^2\left(\frac{2\pi}{\lambda}d2\right)} \quad \text{[Equation 3]}$$

In Equation 3 above, n1 means the refractive index of the lowest layer in the three-layered structure, n2 and d2 mean the refractive index and the thickness of the middle layer in the three-layered structure, and n3 means the refractive index of the highest layer in the three-layered structure.

When the second lower inorganic layer IOL-L2 has a thickness of about ¼ of the wavelength of incident light, and squares of the refractive index of the second lower inorganic layer IOL-L2 and the product of the refractive index of the first lower inorganic layer IOL-L1 and the refractive index of the organic layer OL is the same, the reflectance of light reflected from the organic layer OL may be zero. When the second upper inorganic layer IOL-U2 has a thickness of about ¼ of the wavelength of the incident light, and squares of the refractive index of the second upper inorganic layer IOL-U2 and the product of the refractive index of the first upper inorganic layer IOL-U1 and the refractive index of the organic layer OL is the same, the reflectance of light reflected from the organic layer OL, the first upper inorganic layer IOL-U1, and the second upper inorganic layer IOL-U2 may be zero.

FIG. 8C compares the reflectance of the normal thin film encapsulating layer TFE (comparative example) having the first lower inorganic layer IOL-L1, the organic layer OL, and the first upper inorganic layer IOL-U1, with the thin film encapsulating layer TFE according to FIG. 8B. The thin film encapsulating layer TFE according to the current embodiment has the reflectance smaller than the normal thin film encapsulating layer TFE according to comparative example. The thin film encapsulating layer TFE according to the current embodiment uniformly reduces the reflectance over the entire wavelength band as compared to the normal thin film encapsulating layer TFE according to comparative example. In the thin film encapsulating layer TFE according to the current embodiment, the deviation in reflectance between the lowest reflectance and the highest reflectance is about 1% or less.

Figure 9:
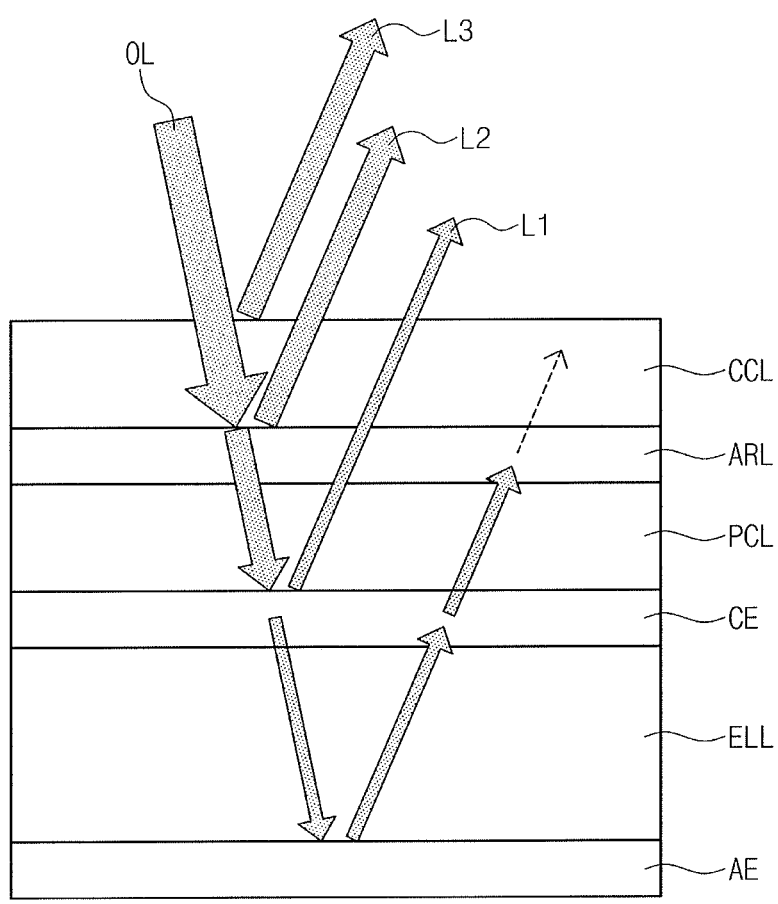
FIG. 9 illustrates a cross-sectional view of a portion of a display panel according to an embodiment.
Figure 10A:
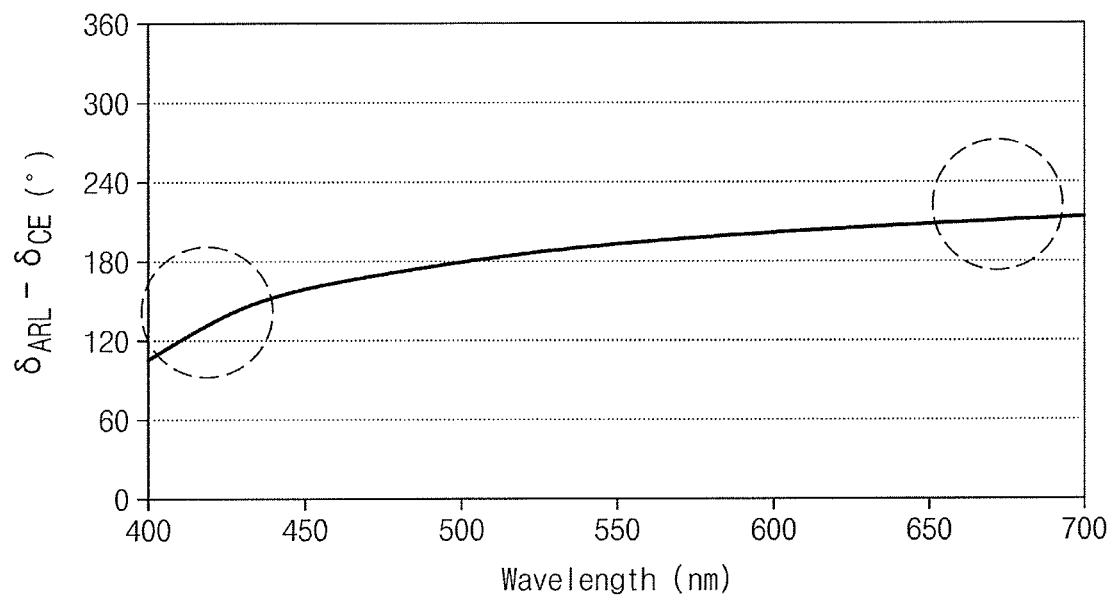
FIG. 10A illustrates a graph of a phase difference according to wavelengths of light reflected from a destructive interference structure.
Figure 10B:
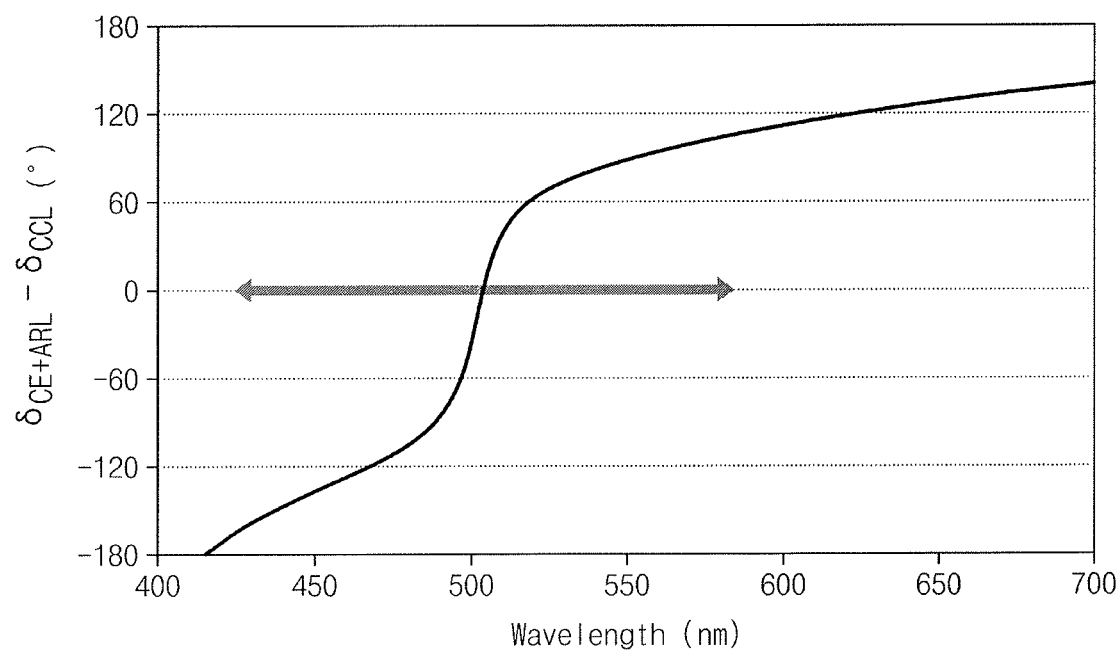
FIG. 10B illustrates a graph of a phase difference between the phase of light subjected to destructive interference and the phase of light reflected from a color compensating layer.
Figure 10C:
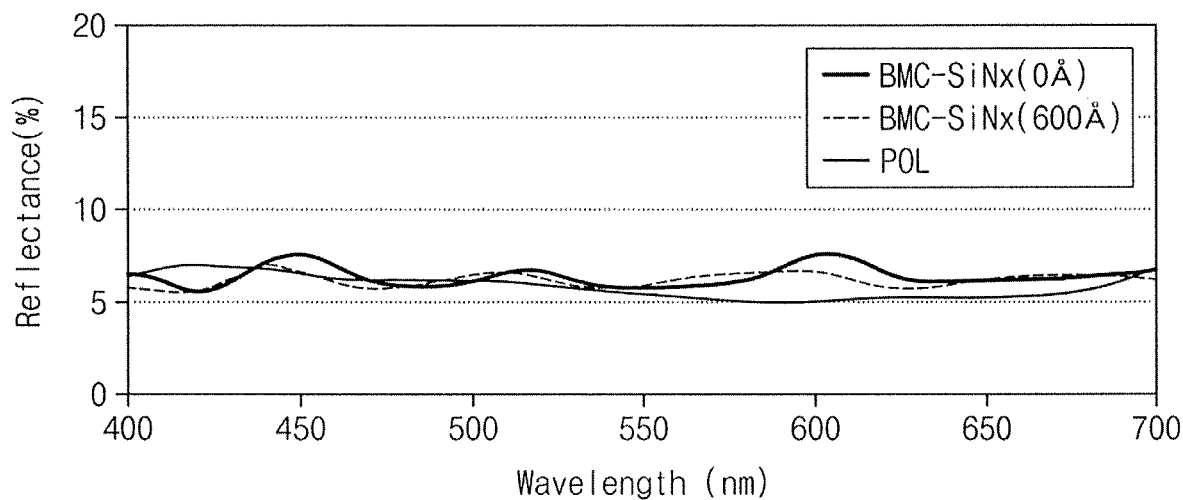
FIG. 10C illustrates a graph of reflectance according to wavelengths of light reflected from the display panel.
Figure 10D:
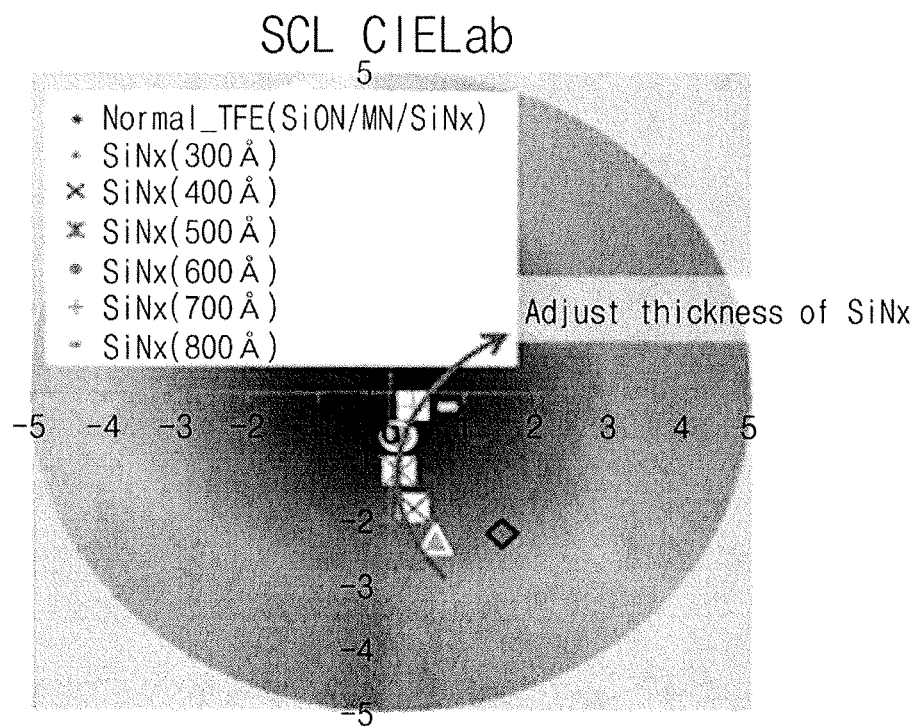
FIG. 10D illustrates a color feel of reflected light which varies according to the thickness of a silicon nitride layer.

FIG. 9 is a cross-sectional view illustrating a portion of a display panel according to an embodiment. FIG. 10A is a graph illustrating a phase difference according to wavelengths of light reflected from a destructive interference structure. FIG. 10B is a graph illustrating a phase difference between the phase of light subjected to destructive interference and the phase of light reflected from a color compensating layer. FIG. 10C is a graph illustrating reflectance according to wavelengths of light reflected from the display panel DP. FIG. 10D illustrates a color feel of reflected light which varies according to the thickness of a silicon nitride layer. Hereinafter, the detailed description on the same configuration as the configuration described with reference to FIGS. 1 to 8C will not be provided.

As illustrated in FIG. 9, a color compensating layer CCL on, e.g., directly on, a reflection preventing layer ARL may be further included. The color compensating layer CCL compensates the color of reflected light which is not completely removed through a destructive interference structure. The color compensating layer CCL may be used in both the display panel DP including the encapsulating substrate CP described with reference to FIGS. 5A to 7B and in the display panel DP including the thin film encapsulating layer TFE described with reference to FIGS. 8A to 8C. The color compensating layer CCL has a refractive index greater than the first lower inorganic layer IOL-L1 described with reference to FIG. 8B.

As illustrated in FIG. 10A, since the phase difference between first light L1 (see FIG. 9) and second light L2 (see FIG. 9) is different according to wavelengths, the light (herein after, referred to as destructively interfered light) reflected through a destructive interference structure may have a predetermined color. Since the phase difference between the first light and the second light at a short wave length and a long wavelength is not 180 degrees, a predetermined color may result.

The color compensating layer CCL may compensate the color of the destructively interfered light by reflecting the light L3 (hereinafter, referred to as color compensated light) having different reflectances according to wavelengths. The destructive interference light and the color compensated light L3 may destructively interfere with each other in a short wavelength range and a long wavelength range, and constructively interfere in a middle wavelength range. As illustrated in FIG. 10B, the middle wavelength range in which the constructive interference occurs may be shifted according to conditions of the color compensating layer CCL. The middle wavelength range in which the constructive interference occurs may vary according to the thickness of the color compensating layer CCL. After analyzing reflectance according to the wavelength of the destructive interference light, the thickness of the color compensating layer CCL may be determined.

In the current embodiment, the color compensating layer CCL may include silicon nitride. The thickness of a silicon nitride layer may be determined according to the color of the destructively interfered light. To compensate the color of the destructively interfered light in a visible light range, the thickness of the silicon nitride layer may be about 400 angstrom to about 800 angstrom.

FIG. 10C illustrates a relationship between wavelength and reflectance according to existence of the color compensating layer CCL. A display module including a polarizing plate has a low reflectance over the entire wavelength range as shown in the graph POL. That is, the deviation between the maximum reflectivity and the minimum reflectance is small. In the structure illustrated in FIG. 9, when the color compensating layer CCL is removed, deviation in reflectance is increased and reflected light has a specific color, as shown in the graph BMC-SiN$_x$ (0 Å). As may be seen in the graph BMC-SiN$_x$ (600 Å), the deviation in reflectance over the entire wavelength range is decreased by including a silicon nitride layer. Accordingly, reflected light may not have a specific color.

As a simulation result illustrated in FIG. 10D, the greater the thickness of the silicon nitride layer in the range of about 400 angstrom to about 800 angstrom, the closer the reflected light to the center of the CIE color space. Accordingly, the light reflected from a display panel DP does not have a specific color and has reduced reflectance. Thus, the reflected light having a similar color feel to neutral black may be provided.

By way of summation and review, one or more embodiments may provide a display module having reduced reflectance with respect to external light. One or more embodiments may provide a head mounted display device having reduced viewability of a ghost image.

A reflection preventing layer may be included in a display module. Thus, the re-reflection of a reflected image incident to a display module may be suppressed by using destructive interference. Accordingly, a ghost image may be reduced.

A phase compensating layer and a hybrid layer may also further reduce the re-reflection of the reflected image. A thin film encapsulating layer may be provided with an upper inorganic layer and a lower inorganic layer both having a multi-layer structure, to further reduce re-reflection of the reflected image.

A silicon nitride layer directly on the reflection preventing layer may adjust the wavelength of light that has been destructively interfered to provide a color feel similar to neutral black.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A head mounted display device comprising:
   a housing providing a darkroom space;
   a display module in the housing, the display module to display an image; and
   an optical lens to expand the image to provide the image to eyeballs of a user,
   wherein the display module includes:
   a first electrode on a base layer;
   a second electrode closer to the optical lens than the first electrode;
   a light-emitting element layer including a light-emitting layer between the first and second electrodes;
   a reflection preventing layer on the second electrode; and
   a phase control layer between the second electrode and the reflection preventing layer, the phase control layer configured to adjust an optical distance between the second electrode and the reflection preventing layer to generate destructive interference between a first light beam, which is a portion of incident light that has been reflected by the optical lens and then by the second electrode, and a second light beam, which is another portion of the incident light that has been reflected by the optical lens and then by the reflection preventing layer.

2. The head mounted display device as claimed in claim 1, wherein the reflection preventing layer includes at least one of chromium (Cr), molybdenum (Mo), titanium (Ti), cobalt (Co), nickel (Ni), aluminum (Al), tungsten (W), manganese (Mn), tellurium (Te), Ni, P, CrN, $TiN_x$, TiAlN, MoO, and $CuO_x$.

3. The head mounted display device as claimed in claim 1, wherein the reflection preventing layer includes a material having a refractive index and an extinction ratio such that the product of the refractive index and the extinction ratio is greater than about 1 and less than about 6.

4. The head mounted display device as claimed in claim 1, wherein the second electrode includes one or more of silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg and CaAg.

5. The head mounted display device as claimed in claim 1, further comprising an encapsulating substrate spaced apart from the reflection preventing layer, the encapsulating substrate to encapsulate the light-emitting element layer.

6. The head mounted display device as claimed in claim 5, further comprising a phase compensating layer on the phase control layer,
wherein a refractive index of the phase compensating layer is less than that of the reflection preventing layer and is greater than that of a medium between the phase compensating layer and the encapsulating substrate.

7. The head mounted display device as claimed in claim 6, wherein the medium is air or a sealing material.

8. The head mounted display device as claimed in claim 6, wherein the refractive index of the phase compensating layer is greater than about 1.0 and smaller than about 2.0.

9. The head mounted display device as claimed in claim 5, further comprising:
a hybrid layer including first refractive index layers and second refractive index layers having different refractive indexes and alternately disposed with the first refractive index layers,
wherein the encapsulating substrate includes a lower surface and an upper surface closer to the optical lens than the lower surface, and
wherein the hybrid layer is on the lower surface of the encapsulating substrate.

10. The head mounted display device as claimed in claim 9, wherein:
each of the first refractive index layers includes one of a silicon oxide layer, a silicon oxynitride layer, and a silicon nitride layer, and
each of the second refractive index layers includes one different from the one of a silicon oxide layer, a silicon oxynitride layer, and a silicon nitride layer.

11. The head mounted display device as claimed in claim 1, further comprising a thin film encapsulating layer on the reflection preventing layer to encapsulate the light-emitting element layer.

12. The head mounted display device as claimed in claim 11, wherein the thin film encapsulating layer includes:
an organic layer;
at least one lower inorganic layer between the reflection preventing layer and the organic layer and having a refractive index greater than the organic layer; and
at least one upper inorganic layer on the organic layer and having a refractive index greater than the organic layer.

13. The head mounted display device as claimed in claim 12, wherein the lower inorganic layer includes:
a first lower inorganic layer between the reflection preventing layer and the organic layer and having a first refractive index; and
a second lower inorganic layer between the first lower inorganic layer and the organic layer and having a second refractive index less than the first refractive index.

14. The head mounted display device as claimed in claim 13, wherein the upper inorganic layer includes:
a first upper inorganic layer on the organic layer and having a first refractive index; and
a second upper inorganic layer between the first upper inorganic layer and the organic layer and having a second refractive index less than the first refractive index.

15. The head mounted display device as claimed in claim 14, wherein the upper inorganic layer further includes a third upper inorganic layer on the first upper inorganic layer and including the same material as the second upper inorganic layer.

16. The head mounted display device as claimed in claim 14, wherein the second lower inorganic layer includes more oxygen atoms in a same volume than the first lower inorganic layer, and
the second upper inorganic layer includes more oxygen atoms in a same volume than the first upper inorganic layer.

17. The head mounted display device as claimed in claim 14, wherein the second lower inorganic layer is thinner than the first lower inorganic layer, and the second upper inorganic layer is thinner than the first upper inorganic layer.

18. The head mounted display device as claimed in claim 1, further comprising a color compensating layer directly on the reflection preventing layer,
wherein the color compensating layer includes silicon nitride.

19. The head mounted display device as claimed in claim 18, wherein the thickness of the color compensating layer is about 400 angstrom to about 800 angstrom.

20. The head mounted display device as claimed in claim 1, wherein the phase control layer includes at least one of $SiN_x$, $SiO_2$, SiCN, LiF, $MgF_2$, $CaF_2$, SiON, $Ta_xO_y$, and $TiO_x$.

21. The head mounted display device as claimed in claim 1, wherein the phase control layer is configured such that a phase difference between the first light beam and the second light beam is about 160° to about 200°.

22. The head mounted display device as claimed in claim 1, wherein the housing includes:
a body part;
a partitioning wall coupled to the body part and to partition the darkroom space into a first darkroom space and a second darkroom space; and
a first sight window and a second sight window which are coupled to the body part and provides the image to the user.

23. The head mounted display device as claimed in claim 22, wherein the display module includes:
a first display module in the first darkroom space and to provide a first image to a first eyeball of the user; and
a second display module in the second darkroom space and to provide a second image to a second eyeball of the user.

24. A display module comprising:
a light-emitting element layer including
a first electrode on a base layer,
a second electrode on the first electrode, the second electrode to receive external light before the first electrode, and
a light-emitting layer between the first electrode and the second electrode;

a reflection preventing layer on the second electrode;

a phase control layer between the second electrode and the reflection preventing layer, the phase control layer to destructively interfere a first light beam, which is external light that has been reflected from the second electrode, and a second light beam, which is external light that has been reflected from the reflection preventing layer; and a thin film encapsulating layer on the reflection preventing layer, the thin film encapsulating layer to encapsulate the light-emitting element layer, wherein the thin film encapsulating layer includes an organic layer, at least one lower inorganic layer between the reflection preventing layer and the organic layer and having a refractive index greater than the organic layer, and at least one upper inorganic layer on the organic layer and having a refractive index greater than the organic layer.

25. The display module as claimed in claim 24, wherein the lower inorganic layer includes:

a first lower inorganic layer between the reflection preventing layer and the organic layer and having a first refractive index; and a second lower inorganic layer between the first lower inorganic layer and the organic layer and having a second refractive index less than the first refractive index.

26. The display module as claimed in claim 25, wherein the upper inorganic layer includes:

a first upper inorganic layer on the organic layer and having a first refractive index; and a second upper inorganic layer between the first upper inorganic layer and the organic layer and having a second refractive index less than the first refractive index.

27. The display module as claimed in claim 26, wherein the upper inorganic layer further includes a third upper inorganic layer on the first upper inorganic layer and including the same material as the second upper inorganic layer.

28. The display module as claimed in claim 26, wherein:

the second lower inorganic layer includes more oxygen atoms in a same volume than the first lower inorganic layer, and the second upper inorganic layer includes more oxygen atoms in a same volume than the first upper inorganic layer.

29. The display module as claimed in claim 26, wherein:

the second lower inorganic layer is thinner than the first lower inorganic layer, and the second upper inorganic layer is thinner than the first upper inorganic layer.

30. The display module as claimed in claim 24, further comprising a color compensating layer directly on the reflection preventing layer, wherein the color compensating layer includes silicon nitride.

31. The display module as claimed in claim 30, wherein a thickness of the color compensating layer is about 400 angstrom to about 800 angstrom.

* * * * *